United States Patent
Rose et al.

(10) Patent No.: US 10,833,260 B2
(45) Date of Patent: Nov. 10, 2020

(54) PHASE-CHANGE MATERIAL (PCM) RF SWITCH HAVING CONTACTS TO PCM AND HEATING ELEMENT

(71) Applicant: Newport Fab, LLC, Newport Beach, CA (US)

(72) Inventors: Jefferson E. Rose, Hawthorne, CA (US); Gregory P. Slovin, Irvine, CA (US); David J. Howard, Irvine, CA (US); Michael J. DeBar, Tustin, CA (US); Nabil El-Hinnawy, Irvine, CA (US)

(73) Assignee: Newport Fab, LLC, Newport Beach, CA (US)

( * ) Notice: Subject to any disclaimer, the term of this patent is extended or adjusted under 35 U.S.C. 154(b) by 0 days.

(21) Appl. No.: 16/709,823

(22) Filed: Dec. 10, 2019

(65) Prior Publication Data

US 2020/0119265 A1 Apr. 16, 2020

Related U.S. Application Data

(60) Division of application No. 16/114,106, filed on Aug. 27, 2018, now Pat. No. 10,707,125, which is a
(Continued)

(51) Int. Cl.
*H01L 47/00* (2006.01)
*H01L 45/00* (2006.01)
(Continued)

(52) U.S. Cl.
CPC ........ *H01L 45/06* (2013.01); *H01L 21/76802* (2013.01); *H01L 21/76843* (2013.01);
(Continued)

(58) Field of Classification Search
CPC ..... H01L 23/522; H01L 45/06; H01L 23/525; H01L 21/76877; H01L 21/76802; H01L 21/76879; H01L 21/76843; H01L 21/76885; H01L 45/065; H01L 45/1226; H01L 45/126; H01L 23/66; H01L 45/143;
(Continued)

(56) References Cited

U.S. PATENT DOCUMENTS

| 6,535,545 B1 | 3/2003 | Ben-Bassat |
| 9,257,647 B2 | 2/2016 | Borodulin |

(Continued)

*Primary Examiner* — Shouxiang Hu
(74) *Attorney, Agent, or Firm* — Farjami & Farjami LLP

(57) ABSTRACT

In fabricating a radio frequency (RF) switch, a phase-change material (PCM) and a heating element, underlying an active segment of the PCM and extending outward and transverse to the PCM, are provided. Lower portions of PCM contacts for connection to passive segments of the PCM are formed, wherein the passive segments extend outward and are transverse to the heating element. Upper portions of the PCM contacts are formed from a lower interconnect metal. Heating element contacts are formed cross-wise to the PCM contacts. The heating element contacts can comprise a top interconnect metal directly connecting with terminal segments of the heating element. The heating element contacts can comprise a top interconnect metal and intermediate metal segments for connecting with the terminal segments of the heating element.

20 Claims, 29 Drawing Sheets

Related U.S. Application Data continuation-in-part of application No. 16/103,490, filed on Aug. 14, 2018, now Pat. No. 10,476,001, and a continuation-in-part of application No. 16/103,587, filed on Aug. 14, 2018, now Pat. No. 10,461,253, and a continuation-in-part of application No. 16/103,646, filed on Aug. 14, 2018, now Pat. No. 10,475,993.

(51) Int. Cl.
  *H01L 23/66* (2006.01)
  *H01L 23/525* (2006.01)
  *H01L 21/768* (2006.01)
  *H01L 23/522* (2006.01)

(52) U.S. Cl.
  CPC .. *H01L 21/76877* (2013.01); *H01L 21/76879* (2013.01); *H01L 21/76885* (2013.01); *H01L 23/522* (2013.01); *H01L 23/525* (2013.01); *H01L 23/66* (2013.01); *H01L 45/065* (2013.01); *H01L 45/126* (2013.01); *H01L 45/1226* (2013.01); *H01L 45/1286* (2013.01); *H01L 45/143* (2013.01); *H01L 45/144* (2013.01); *H01L 45/1675* (2013.01)

(58) Field of Classification Search
  CPC ............... H01L 45/144; H01L 45/1675; H01L 45/1286; H01L 45/16
  See application file for complete search history.

(56) References Cited

U.S. PATENT DOCUMENTS

| | | | |
|---|---|---|---|
| 9,362,492 B2 * | 6/2016 | Goktepeli | ........... H01L 45/1608 |
| 9,368,720 B1 | 6/2016 | Moon | |
| 10,164,608 B2 | 12/2018 | Belot | |
| 10,461,253 B1 | 10/2019 | Slovin | |
| 10,505,106 B1 | 12/2019 | Joshi | |
| 10,529,922 B1 | 1/2020 | Howard | |
| 2006/0027924 A1 * | 2/2006 | Chen | ................. H01L 21/76829 |
| | | | 257/751 |
| 2007/0235707 A1 * | 10/2007 | Kordus, II | .......... H01L 45/1226 |
| | | | 257/2 |
| 2008/0029753 A1 * | 2/2008 | Xu | .......................... H03F 3/195 |
| | | | 257/4 |
| 2010/0246247 A1 | 9/2010 | Kim | |
| 2014/0110657 A1 | 4/2014 | Redaelli | |
| 2014/0191181 A1 | 7/2014 | Moon | |
| 2016/0056373 A1 | 2/2016 | Goktepeli | |
| 2016/0204190 A1 * | 7/2016 | Chu | ..................... H01L 23/5226 |
| | | | 257/532 |
| 2017/0187347 A1 | 6/2017 | Rinaldi | |
| 2017/0207764 A1 | 7/2017 | Wang | |
| 2018/0005786 A1 | 1/2018 | Navarro | |
| 2018/0138894 A1 | 5/2018 | Belot | |
| 2018/0266974 A1 | 9/2018 | Khosravani | |
| 2019/0088721 A1 | 3/2019 | Reig | |
| 2019/0296718 A1 | 9/2019 | Birkbeck | |

\* cited by examiner

PHASE-CHANGE MATERIAL (PCM) RF SWITCH HAVING CONTACTS TO PCM AND HEATING ELEMENT

CLAIMS OF PRIORITY

This is a divisional of application Ser. No. 16/114,106 filed on Aug. 27, 2018. Application Ser. No. 16/114,106 filed on Aug. 27, 2018 ("the parent application") is a continuation-in-part of and claims the benefit of and priority to application Ser. No. 16/103,490 filed on Aug. 14, 2018, titled "Manufacturing RF Switch Based on Phase-Change Material." The parent application is also a continuation-in-part of and claims the benefit of and priority to application Ser. No. 16/103,587 filed on Aug. 14, 2018, titled "Design for High Reliability RF Switch Based on Phase-Change Material." The parent application is further a continuation-in-part of and claims the benefit of and priority to application Ser. No. 16/103,646 filed on Aug. 14, 2018, titled "PCM RF Switch Fabrication with Subtractively Formed Heater." The disclosures and contents of all of the above-identified applications are hereby incorporated fully by reference into the parent application and the present divisional application.

BACKGROUND

Phase-change materials (PCM) are capable of transforming from a crystalline phase to an amorphous phase. These two solid phases exhibit differences in electrical properties, and semiconductor devices can advantageously exploit these differences. Given the ever-increasing reliance on radio frequency (RF) communication, there is particular need for RF switching devices to exploit phase-change materials. However, the capability of phase-change materials for phase transformation depends heavily on how they are exposed to thermal energy and how they are allowed to release thermal energy. For example, in order to transform into an amorphous state, phase-change materials may need to achieve temperatures of approximately seven hundred degrees Celsius (700° C.) or more, and may need to cool down within hundreds of nanoseconds.

Heating elements in PCM RF switches and contacts to the heating elements often create tradeoffs with parasitics associated with RF frequencies and result in performance tradeoffs. Additionally, the performance of an RF switch using PCM depends heavily on how contacts to the PCM are made. Fabricating contacts to both PCM and to heating elements without significant RF performance tradeoffs becomes complex, especially where the RF switch is designed primarily around thermal performance. Accordingly, accommodating PCM in RF switches can present significant manufacturing challenges. Specialty manufacturing is often impractical, and large scale manufacturing generally trades practicality for the ability to control device characteristics and critical dimensions.

Thus, there is a need in the art to simply and reliably manufacture low parasitics PCM RF switches.

SUMMARY

The present disclosure is directed to fabrication of contacts and interconnect metallization in an RF switch having a phase-change material (PCM) and a heating element, substantially as shown in and/or described in connection with at least one of the figures, and as set forth in the claims.

DETAILED DESCRIPTION

Figure 1A:
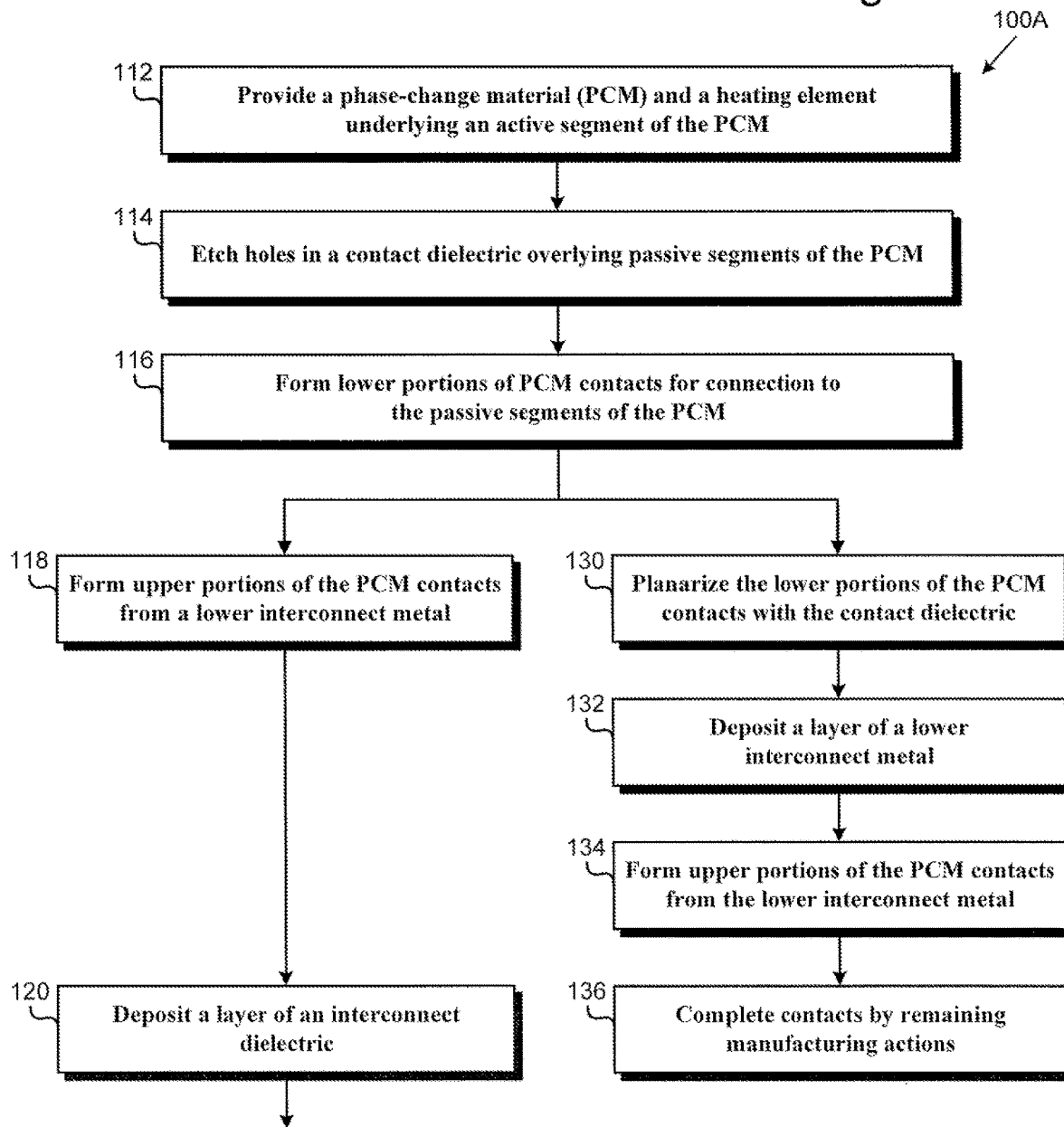
FIGS. 1A and 1B each illustrate a portion of a flowchart of an exemplary method for manufacturing contacts and interconnect metallization in a phase-change material (PCM) RF switch according to one implementation of the present application.

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

Figure 1B:
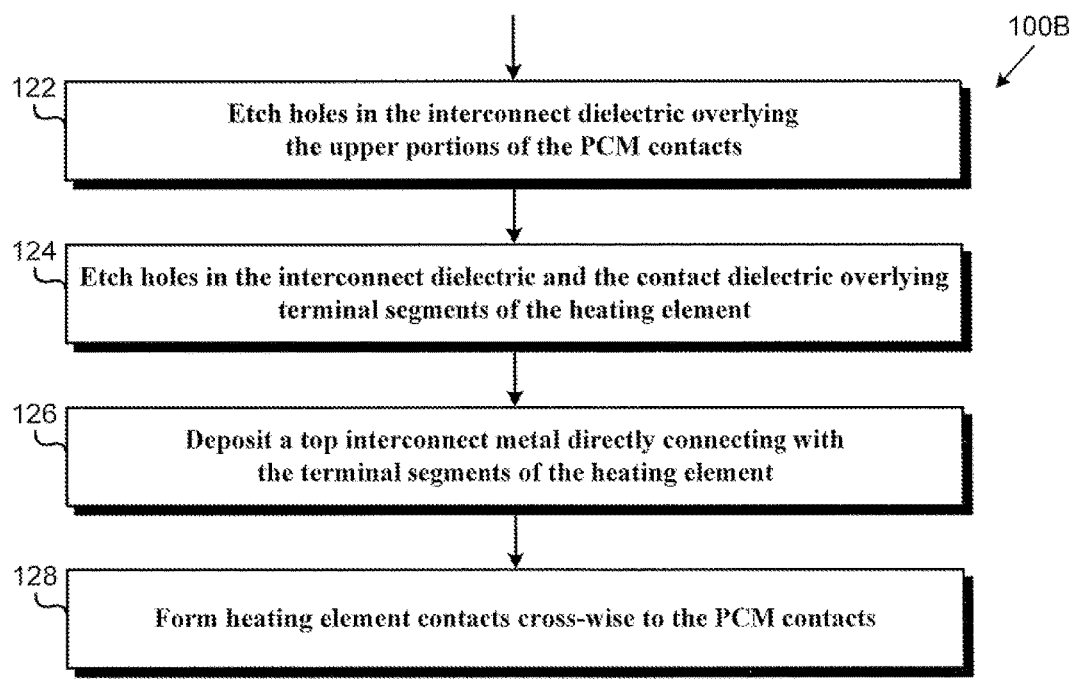

FIG. 1A illustrates a portion of a flowchart of an exemplary method for manufacturing contacts and interconnect metallization in a phase-change material (PCM) RF switch according to one implementation of the present application. Certain details and features have been left out of the flowchart that are apparent to a person of ordinary skill in the art. For example, an action may consist of one or more subactions or may involve specialized equipment or materials, as known in the art. Moreover, some actions, such as masking and cleaning actions, are omitted so as not to distract from the illustrated actions. Actions 112 through 120 and actions 130 through 136 shown in flowchart 100A of FIG. 1A, together with actions 122 through 128 in flowchart 100B of FIG. 1B, are sufficient to describe exemplary implementations of the present inventive concepts, other implementations of the present inventive concepts may utilize actions different from those shown in flowcharts 100A and 100B. Moreover, structures shown in FIGS. 2A through 14C illustrate the results of performing actions 112 through 136.

By way of overview and referring to flowcharts 100A and 100B, the present exemplary implementation begins with action 112 by providing a PCM and a heating element underlying an active segment of the PCM. The exemplary implementations continue with action 114 by etching holes in a contact dielectric overlying passive segments of the PCM, and then with action 116 by forming lower portions of PCM contacts for connection to the passive segments of the PCM. From action 116, one implementation can continue with action 118, or an alternative implementation can continue with action 130. As described below, where the method continues with action 118, upper portions of PCM contacts will have an offset towards the active segment of the PCM. Where the method continues with action 130, and upper portions of PCM contacts will have an offset away from the active segment of the PCM.

Addressing the implementation having upper portions of PCM contacts with an offset towards the active segment of the PCM, action 118 includes forming upper portions of the PCM contacts from a lower interconnect metal. From action 118, the method continues with action 120 by depositing a layer of an interconnect dielectric. From action 120, the method continues with and concludes with actions 122 through 128.

Addressing the alternative implementation having upper portions of PCM contacts with an offset away from the active segment of the PCM, action 130 includes planarizing the lower portions of the PCM contacts with the contact dielectric. From action 130, the method continues with action 132 by depositing a layer of a lower interconnect metal. The method continues with action 134 by forming upper portions of the PCM contacts from the lower interconnect metal. The method concludes with action 136 by completing contacts by remaining manufacturing actions.

FIGS. 2A through 6C and illustrate the results of performing actions 112 through 120 of flowchart 100A of FIG. 1A, according to one implementation of the present disclosure. For example, structures 212A, 212B, and 212C, show a PCM RF switch structure after performing action 112, structures 314A, 314B, and 314C show a PCM RF switch structure after performing action 114, and so forth.

Figure 2A:
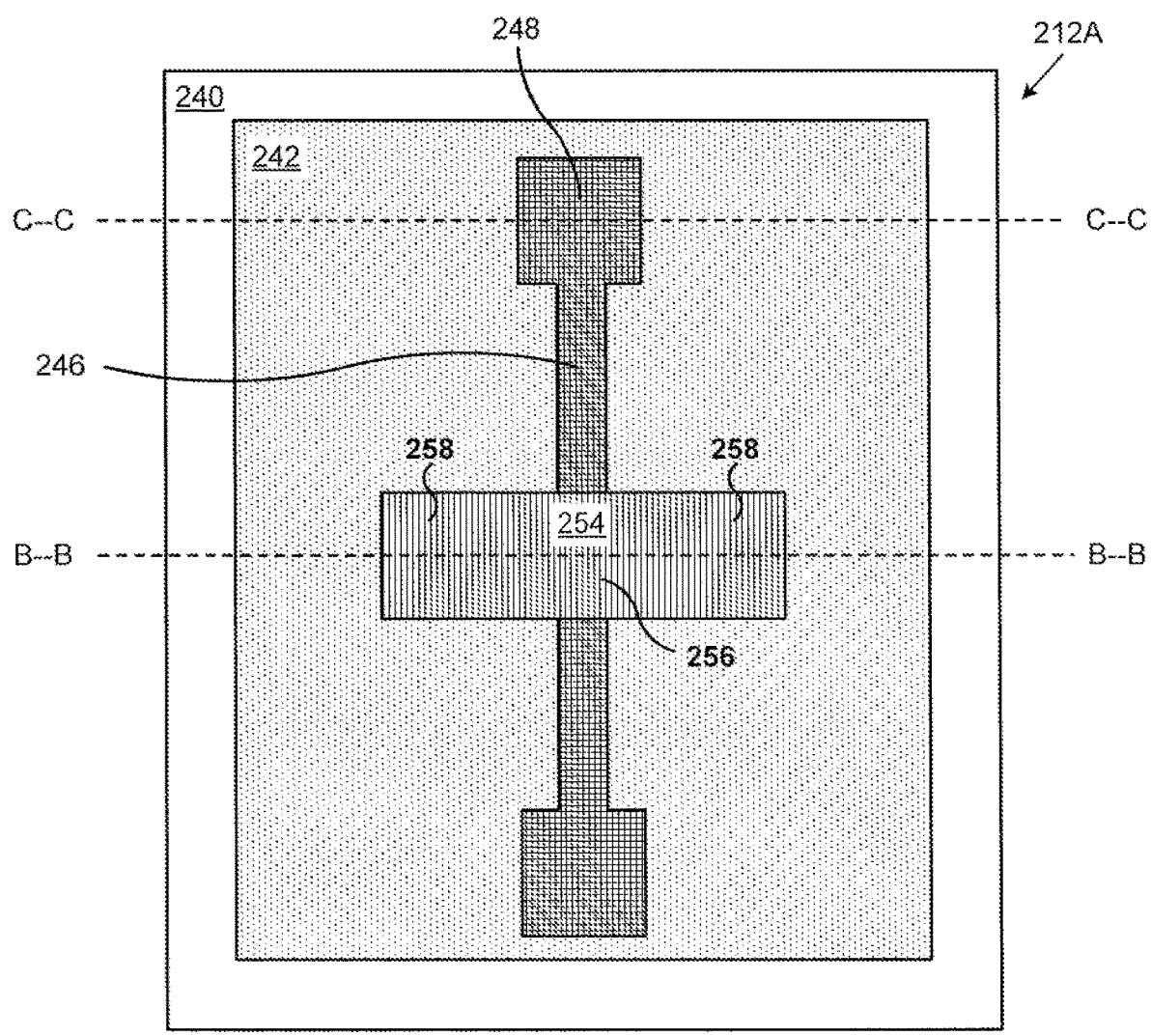
FIG. 2A illustrates a top view of a portion of a PCM RF switch structure processed in accordance with an action in the flowchart of FIG. 2A according to one implementation of the present application.

Referring to FIG. 2A, PCM RF switch structure 212A illustrates a top view of a portion of a PCM RF switch structure processed in accordance with action 112 in flowchart 100A of FIG. 1A according to one implementation of the present application. As shown in FIG. 2A, PCM RF switch structure 212A includes substrate 240, heat spreader 242, heating element 246 having terminal segments 248, and PCM 254 having active segment 256 and passive segments 258. For purposes of illustration, the top view in FIG. 2A shows selected structures of PCM RF switch structure 212A. PCM RF switch structure 212A may include other structures not shown in FIG. 2A.

Heat spreader 242 overlies substrate 240. Heat spreader 242 also underlies heating element 246. Heat spreader 242 generally dissipates excess heat generated by PCM RF switch structure 212A. In particular, heat spreader 242 dissipates excess heat generated by heating element 246 after a heat pulse, such as a crystallizing pulse or an amorphizing pulse, has transformed the state of PCM 254. Heat spreader 242 may be any material with high thermal conductivity. In one implementation, heat spreader 242 may be a material with both high thermal conductivity and high electrical resistivity. In various implementations, heat spreader 242 can comprise aluminum nitride (AlN), aluminum oxide ($Al_xO_Y$), beryllium oxide ($Be_xO_Y$), silicon carbide (SiC), diamond, or diamond-like carbon. In one implementation, heat spreader 242 includes strain-relieving chamfers (not shown) at its sides and/or at its corners. In one implementation, substrate 240 is an insulator, such as silicon oxide ($SiO_2$). In various implementations, substrate 240 is a silicon (Si), silicon-on-insulator (SOI), sapphire, complementary metal-oxide-semiconductor (CMOS), bipolar CMOS (BiCMOS), or group III-V substrate. In one implementation, heat spreader 242 itself performs as a substrate and a separate substrate is not used. For example, heat spreader 242 can comprise Si and be provided without substrate 240. In one implementation, heat spreader 242 can be integrated with substrate 240. It is noted that in FIG. 2A, the top area of substrate 240 is greater than that of heat spreader 242. However, in some implementations heat spreader 242 can be coextensive with substrate 240.

Heating element 246 overlies heat spreader 242. Heating element 246 also underlies PCM 254. Heating element 246 in PCM RF switch structure 212A generates a crystallizing pulse or an amorphizing pulse for transforming active region 256 of PCM 254. Heating element 246 can comprise any material capable of Joule heating that has a melting temperature higher than that of PCM 254. Preferably, heating element 246 comprises a material that exhibits little or substantially no electromigration. In various implementations, heating element 246 can comprise tungsten (W), molybdenum (Mo), titanium (Ti), titanium nitride (TiN), titanium tungsten (TiW), tantalum (Ta), nickel chromium (NiCr), or nickel chromium silicon (NiCrSi).

PCM 254 overlies heating element 246. PCM 254 includes active segment 256 and passive segments 258. As used herein, "active segment" refers to a segment of PCM that transforms between crystalline and amorphous states, for example, in response to a crystallizing or an amorphizing heat pulse, whereas "passive segment" refers to a segment of PCM that does not make such transformation and maintains a crystalline state (i.e., maintains a conductive state). PCM 254 can be germanium telluride ($Ge_xTe_Y$), germanium antimony telluride ($Ge_xSb_YTe_Z$), germanium selenide ($Ge_xSe_Y$), or any other chalcogenide. It is noted that in FIG. 2A, heating element 246 extends outwards and is transverse to PCM 254. Current flowing in heating element 246 flows substantially under active segment 256 of PCM 254. In various implementations, PCM 254 can be germanium telluride having from forty percent to sixty percent germanium by composition (i.e., $Ge_xTe_Y$, where $0.4 \leq X \leq 0.6$ and $Y=1-X$). The material for PCM 254 can be chosen based upon ON state resistivity, OFF state electric field breakdown threshold, crystallization temperature, melting temperature, or other considerations.

Figure 2B:
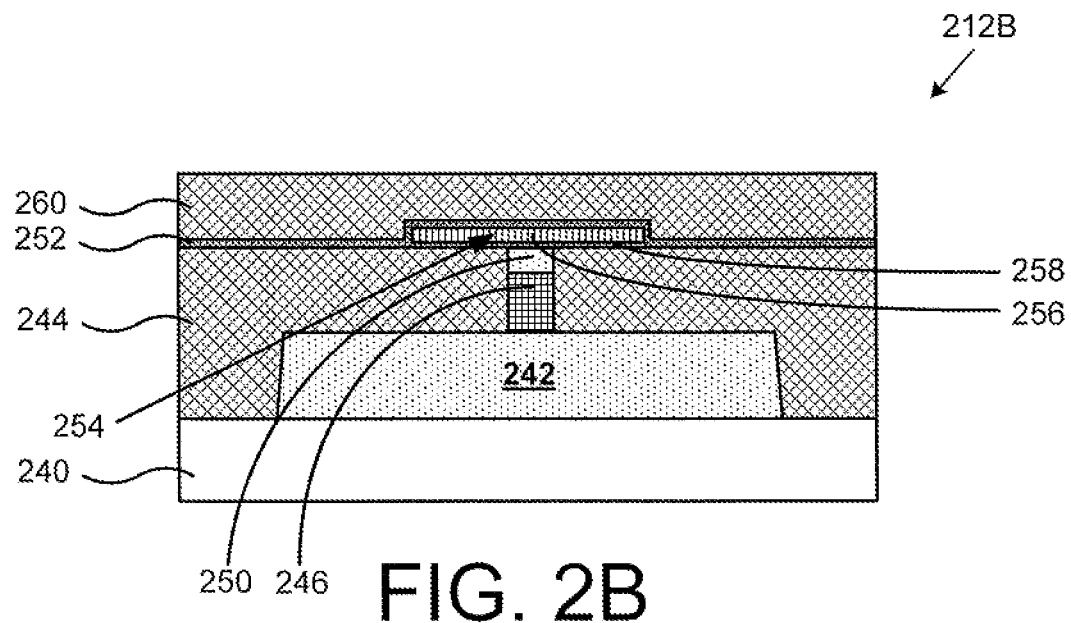
FIGS. 2B and 2C each illustrate a cross-sectional view of a portion of a PCM RF switch structure processed in accordance with an action in the flowchart of FIG. 1A according to one implementation of the present application.

Referring to FIG. 2B, PCM RF switch structure 212B illustrates a cross-sectional view of a portion of a PCM RF switch structure processed in accordance with action 112 in flowchart 100A of FIG. 1A according to one implementation of the present application. FIG. 2B represents a cross-sectional view along line "B-B" in FIG. 2A. As shown in FIG. 2B, PCM RF switch structure 212B includes substrate 240, heat spreader 242, lower dielectric 244, heating element 246, nugget 250, combined layer 252, PCM 254 having active segment 256 and passive segments 258, and contact dielectric 260. Substrate 240, heat spreader 242, heating element 246, and PCM 254 in FIG. 2B may have any implementations and advantages described above.

Referring to FIG. 2B, lower dielectric 244 is situated over heat spreader 242, which is in turn situated over substrate 240. In one implementation, lower dielectric 244 is $SiO_2$. In other implementations, lower dielectric 244 is silicon nitride ($Si_xN_Y$), or another dielectric. In one implementation, lower dielectric 244 is also situated under heating element 246.

In PCM RF switch structure 212B, nugget 250 is situated on top of heating element 246 and under active segment 256 of PCM 254. As used herein "nugget" refers to a segment of thermally conductive and electrically insulating material on top of heating element 246. Nugget 250 ensures efficient heat transfer between heating element 246 and active segment 256 of PCM 254, while preventing electrical signals from leaking out from the path between PCM contacts to heating element 246 or to other neighboring structures. Nugget 250 can comprise any material with high thermal conductivity and high electrical resistivity. In various implementations, nugget 250 can comprise AlN, $Al_xO_Y$, $Be_xO_Y$, SiC, $Si_xN_Y$, diamond, or diamond-like carbon. In the implementation illustrated in FIG. 3A, nugget 250 is shown to comprise the same material as heat spreader 242. However, in other implementations, nugget 250 and heat spreader 242 can comprise different materials. In one implementation, nugget 250 can have a higher thermal conductivity than heat spreader 242 to ensure that a heat pulse generated by heating element 246 dissipates toward active segment 256 of PCM 254 more rapidly than it dissipates toward heat spreader 242.

As shown in FIG. 2B, PCM RF switch structure 212B can optionally include combined layer 252. Combined layer 252 includes segments situated on the sides of PCM 254 and over PCM 254. The segments of combined layer 252 situated on the sides of PCM 254 may be referred to as a passivation layer in the present application. The segment of combined layer 252 situated over PCM 254 includes a passivation layer and a contact uniformity support layer which is situated on and is in direct contact with PCM 254. The contact uniformity support layer assists during formation of holes for lower portions of PCM contacts, as described below. In various implementations, segments of combined layer 252 can comprise silicon nitride ($Si_xN_Y$) or an oxide, such as $SiO_2$. In FIG. 2B, contact dielectric 260 is situated over combined layer 252 (in case combined layer 252 is utilized) and over PCM 254 and first dielectric 244. In one implementation, contact dielectric 260 is $SiO_2$. In other implementations, contact dielectric 260 is $Si_xN_Y$, or another dielectric.

Figure 2C:
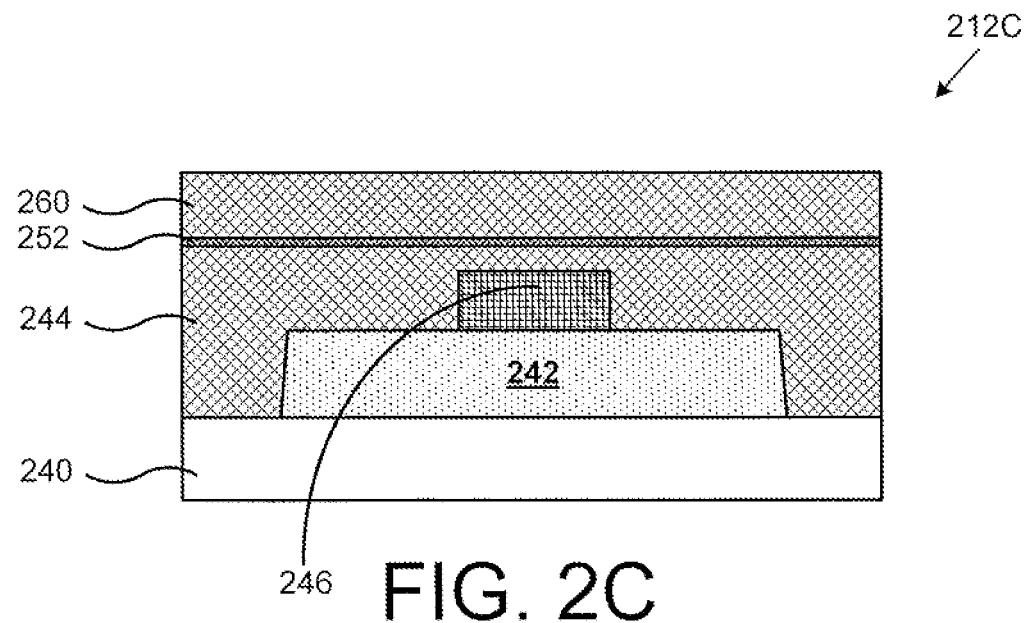

Referring to FIG. 2C, PCM RF switch structure 212C illustrates a cross-sectional view of a portion of a PCM RF switch structure processed in accordance with action 112 in flowchart 100A of FIG. 1A according to one implementation of the present application. FIG. 2C represents a cross-sectional view along line "C-C" in FIG. 2A. As shown in FIG. 2C, PCM RF switch structure 212C includes substrate 240, heat spreader 242, lower dielectric 244 that is situated over and around heating element 246, combined layer 252, and contact dielectric 260. Substrate 240, heat spreader 242, lower dielectric 244, heating element 246, combined layer 252, and contact dielectric 260 in FIG. 2C may have any implementations and advantages described above. Notably, the cross-sectional view of PCM RF switch structure 212C in FIG. 2C does not include PCM 254, because line "C-C" in FIG. 2A lies along terminal segment 248 of heating element 246, which extends outward and is transverse to PCM 254.

Figure 3A:
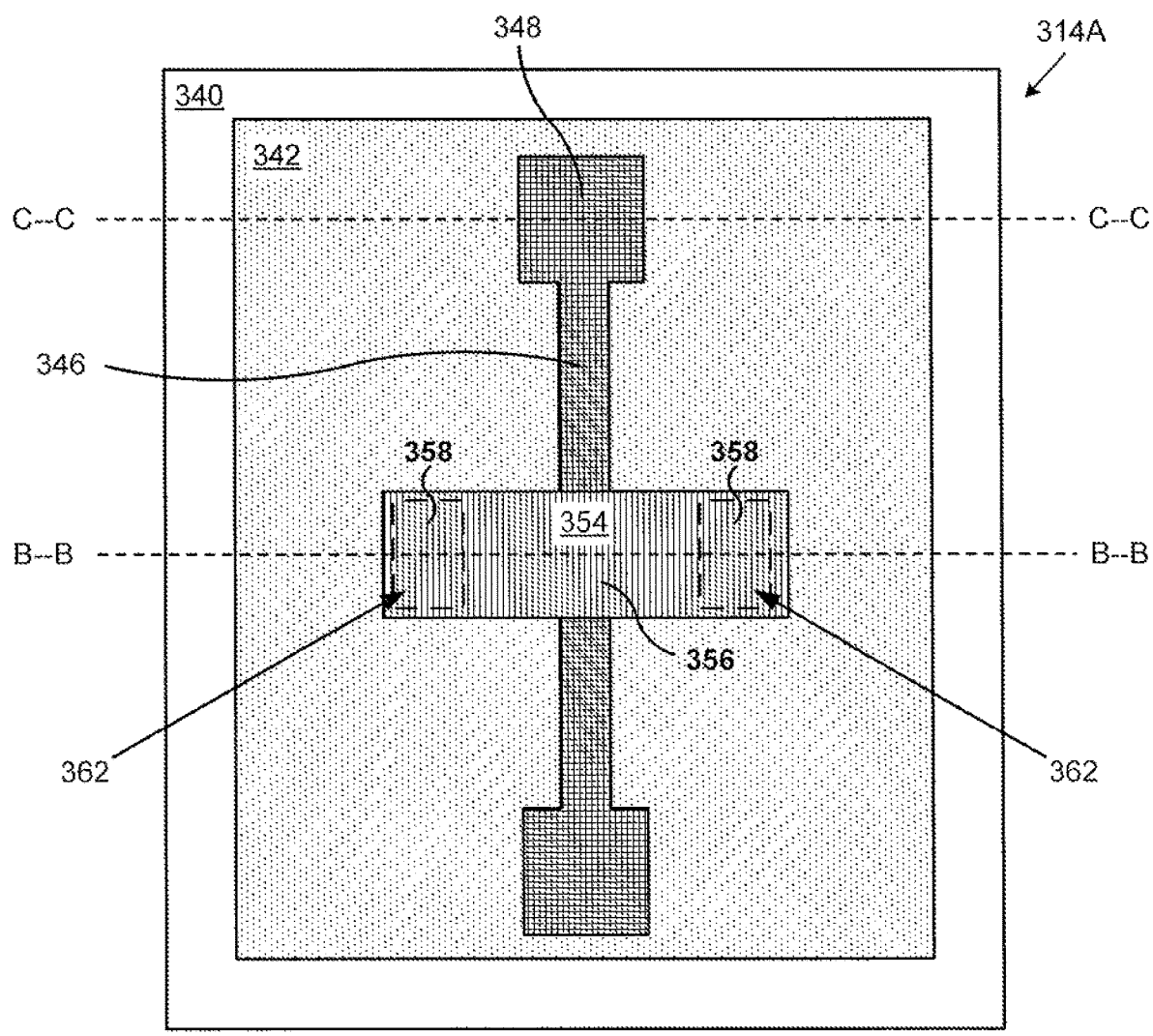
FIG. 3A illustrates a top view of a portion of a PCM RF switch structure processed in accordance with an action in the flowchart of FIG. 1A according to one implementation of the present application.

Referring to FIG. 3A, PCM RF switch structure 314A illustrates a top view of a portion of a PCM RF switch structure processed in accordance with action 114 in flowchart 100A of FIG. 1A according to one implementation of the present application. As shown in FIG. 3A, PCM RF switch structure 314A includes substrate 340, heat spreader 342, heating element 346 having terminal segments 348, PCM 354 having active segment 356 and passive segments 358, and holes 362. For purposes of illustration, the top view in FIG. 3A shows selected structures of PCM RF switch structure 314A. PCM RF switch structure 314A may include other structures not shown in FIG. 3A. Notably, in FIG. 3A, holes 362 (shown with dashed lines) are etched in contact dielectric 360 (shown in FIG. 3B) overlying passive segments 358 of PCM 354.

Figure 3B:
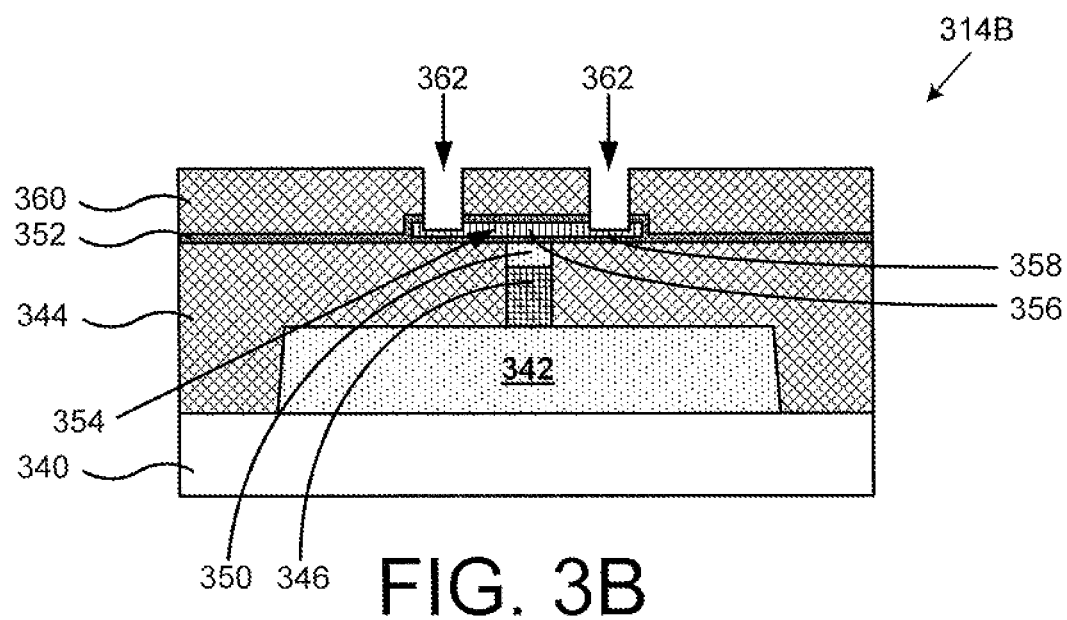
FIGS. 3B and 3C each illustrate a cross-sectional view of a portion of a PCM RF switch structure processed in accordance with an action in the flowchart of FIG. 1A according to one implementation of the present application.

Referring to FIG. 3B, PCM RF switch structure 314B illustrates a cross-sectional view of a portion of a PCM RF switch structure processed in accordance with action 114 in flowchart 100A of FIG. 1A according to one implementation of the present application. FIG. 3B represents a cross-sectional view along line "B-B" in FIG. 3A. As shown in FIG. 3B, PCM RF switch structure 314B includes substrate 340, heat spreader 342, lower dielectric 344, heating element 346, nugget 350, combined layer 352, PCM 354 having active segment 356 and passive segments 358, contact dielectric 360, and holes 362. Substrate 340, heat spreader 342, lower dielectric 344, heating element 346, nugget 350, combined layer 352, PCM 354 having active segment 356 and passive segments 358, and contact dielectric 360 in FIG. 3B may have any implementations and advantages described above.

As shown in FIG. 3B, holes 362 are etched through contact dielectric 360 partially into passive segments 358 of PCM 354. Holes 362 are also etched through contact uniformity support layer of combined layer 352 (in case combined layer 352 is used). In this implementation, action 114 for etching holes in contact dielectric 360 overlying passive segments 358 of PCM 354 may comprise two different etching actions. In the first etching action, contact dielectric 360 can be aggressively etched to form most of holes 362. This first etching action can use a selective etch, for example, a fluorine-based plasma dry etch, and contact uniformity support layer of combined layer 352 can perform as an etch stop while contact dielectric 360 is selectively etched. In the second etching action, contact uniformity support layer of combined layer 352 can be etched less aggressively. As a result, PCM 354 will remain substantially intact, and uniform contact can be made to PCM 354. Because the $R_{ON}$ of an RF switch depends heavily on the uniformity of contacts made with PCM 354, the $R_{ON}$ will be significantly lower when contact uniformity support layer of combined layer 352 is used. In one implementation, contact uniformity support layer of combined layer 352 is substantially thinner than contact dielectric 360.

Figure 3C:
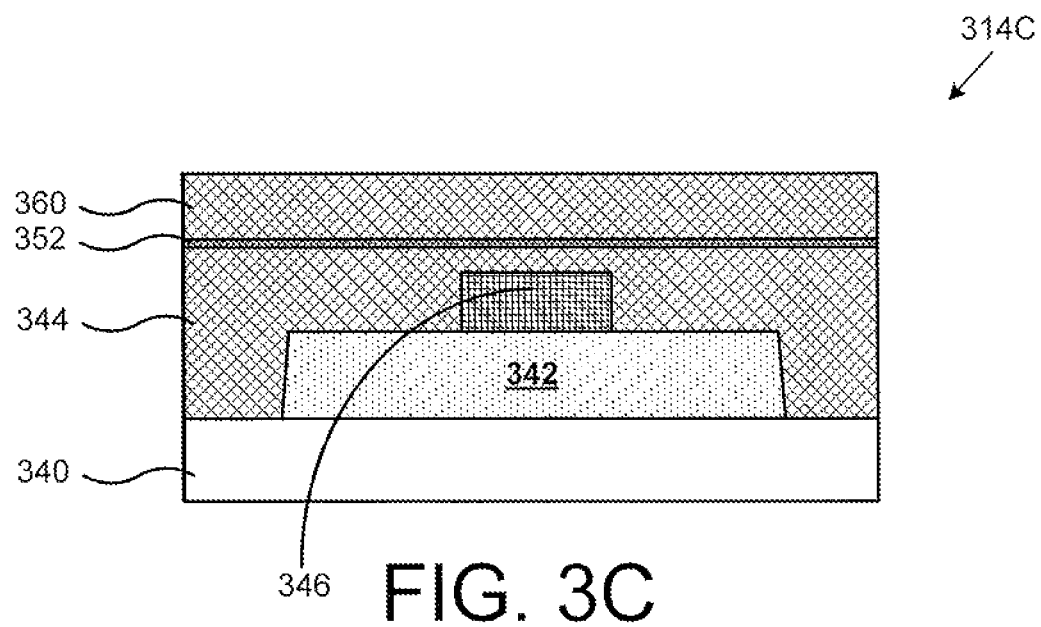

Referring to FIG. 3C, PCM RF switch structure 314C illustrates a cross-sectional view of a portion of a PCM RF switch structure processed in accordance with action 114 in flowchart 100A of FIG. 1A according to one implementation of the present application. FIG. 3C represents a cross-sectional view along line "C-C" in FIG. 3A. As shown in FIG. 3C, PCM RF switch structure 314C includes substrate 340, heat spreader 342, lower dielectric 344, heating element 346, combined layer 352, and contact dielectric 360. Substrate 340, heat spreader 342, lower dielectric 344, heating element 346, combined layer 352, and contact dielectric 360 in FIG. 3C may have any implementations and advantages described above. Notably, the cross-sectional view of PCM RF switch structure 314C in FIG. 3C does not include PCM 354 or holes 362, because line "C-C" in FIG. 3A lies along terminal segment 348 of heating element 346, which extends outward and is transverse to PCM 354.

Figure 4A:
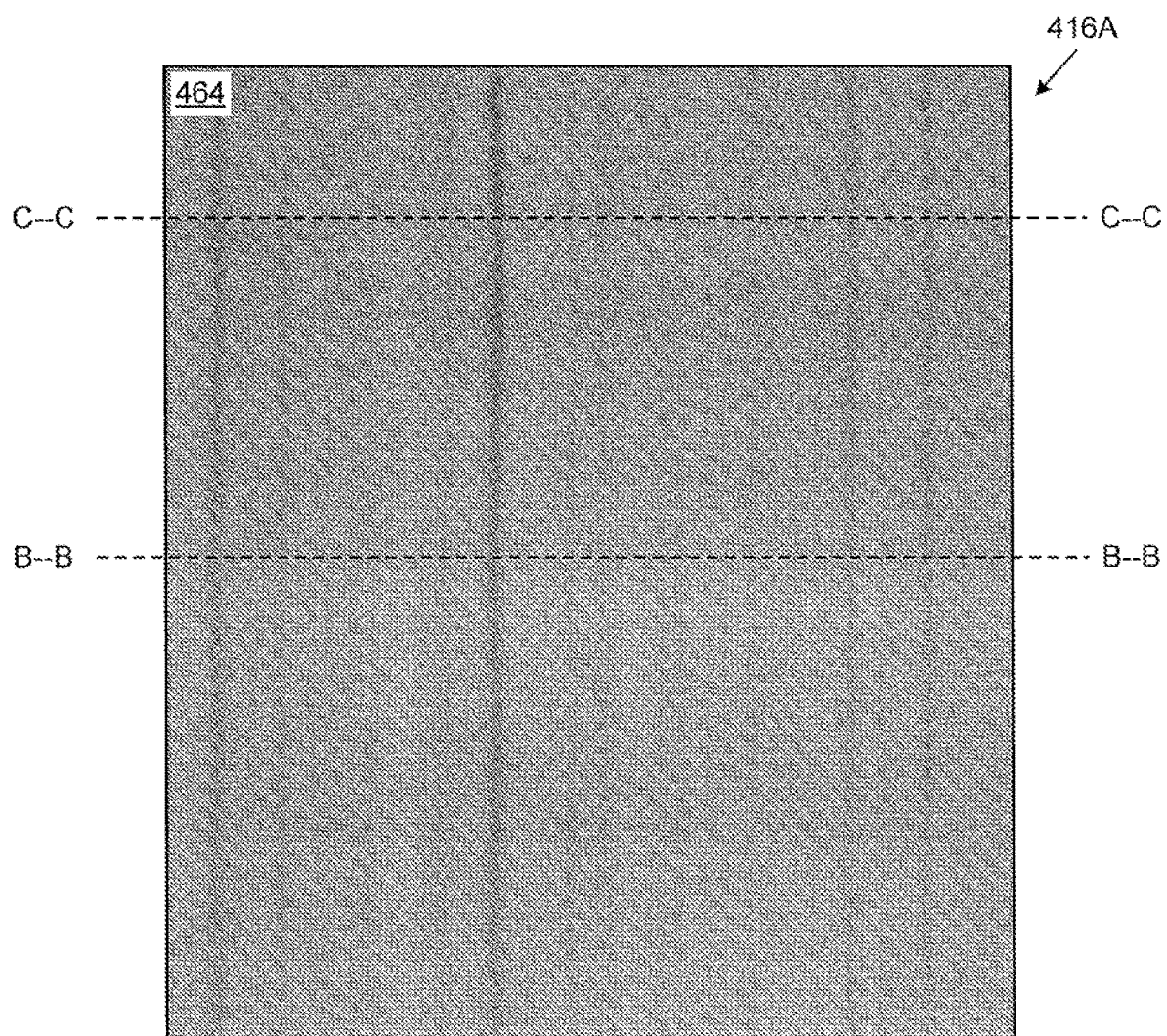
FIG. 4A illustrates a top view of a portion of a PCM RF switch structure processed in accordance with an action in the flowchart of FIG. 1A according to one implementation of the present application.

Referring to FIG. 4A, PCM RF switch structure 416A illustrates a top view of a portion of a PCM RF switch structure processed in accordance with action 116 in flowchart 100A of FIG. 1A according to one implementation of the present application. As shown in FIG. 4A, PCM RF switch structure 416A includes lower interconnect metal 464. For purposes of illustration, the top view in FIG. 4A shows selected structures of PCM RF switch structure 416A. PCM RF switch structure 416A may include other structures not shown in FIG. 4A. Notably, in FIG. 4A, lower interconnect metal 464 is situated atop PCM RF switch structure 416A and in holes 362 (shown in FIG. 3B).

Figure 4B:
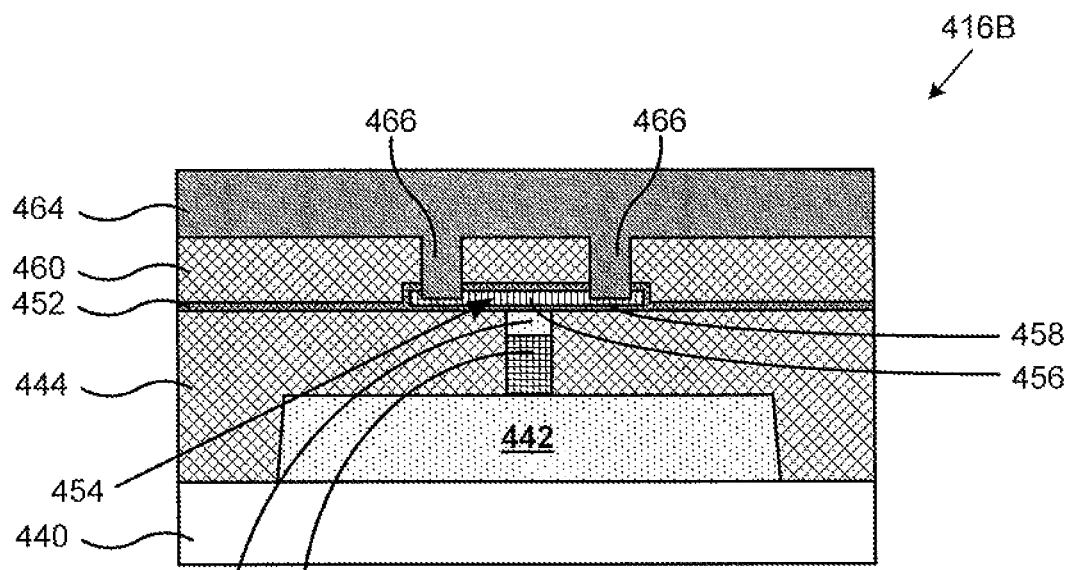
FIGS. 4B and 4C each illustrate a cross-sectional view of a portion of a PCM RF switch structure processed in accordance with an action in the flowchart of FIG. 1A according to one implementation of the present application.

Referring to FIG. 4B, PCM RF switch structure 416B illustrates a cross-sectional view of a portion of a PCM RF switch structure processed in accordance with action 116 in flowchart 100A of FIG. 1A according to one implementation of the present application. FIG. 4B represents a cross-sectional view along line "B-B" in FIG. 4A. As shown in FIG. 4B, PCM RF switch structure 416B includes substrate 440, heat spreader 442, lower dielectric 444, heating element 446, nugget 450, combined layer 452, PCM 454 having active segment 456 and passive segments 458, contact dielectric 460, and lower interconnect metal 464 having lower portions 466. Substrate 440, heat spreader 442, lower dielectric 444, heating element 446, nugget 450, combined layer 452, PCM 454 having active segment 456 and passive segments 458, and contact dielectric 460 in FIG. 4B may have any implementations and advantages described above.

As shown in FIG. 4B, lower interconnect metal 464 is deposited in holes 362 (shown in FIG. 3B) and over contact dielectric 460. Within holes 362 (shown in FIG. 3B), lower interconnect metal 464 forms lower portions 466 of PCM contacts connected to passive segments 458 of PCM 454. In various implementations, lower interconnect metal 464 can comprise tungsten (W), copper (Cu), or aluminum (Al). In one implementation, the top surface of lower interconnect metal 464 can have indents in the vicinity of lower portions 466 of PCM contacts.

Figure 4C:
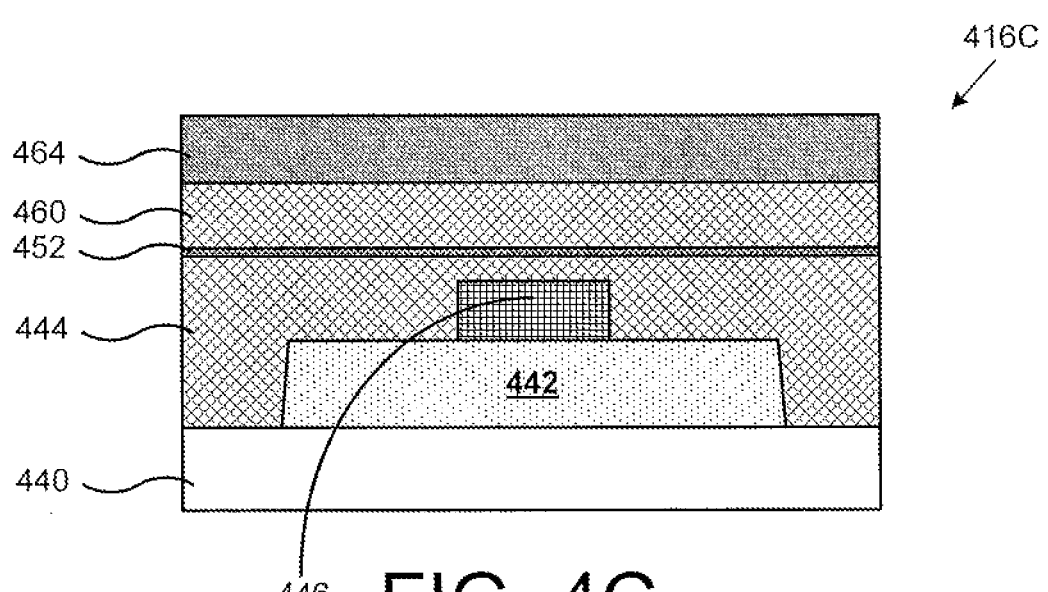

Referring to FIG. 4C, PCM RF switch structure 416C illustrates a cross-sectional view of a portion of a PCM RF switch structure processed in accordance with action 116 in flowchart 100A of FIG. 1A according to one implementation of the present application. FIG. 4C represents a cross-sectional view along line "C-C" in FIG. 4A. As shown in FIG. 4C, PCM RF switch structure 416C includes substrate 440, heat spreader 442, lower dielectric 444, heating element 446, combined layer 452, PCM 454 having active segment 456 and passive segments 458, contact dielectric 460, and lower interconnect metal 464. Substrate 440, heat spreader 442, lower dielectric 444, heating element 446, combined layer 452, PCM 454 having active segment 456 and passive segments 458, contact dielectric 460, and lower interconnect metal 464 in FIG. 4C may have any implementations and advantages described above. Notably, the cross-sectional view of PCM RF switch structure 416C in FIG. 4C does not include lower portions 466 of PCM contacts, because line "C-C" in FIG. 4A lies along terminal a segment of heating element 446, which extends outward and is transverse to PCM 454.

Figure 5A:
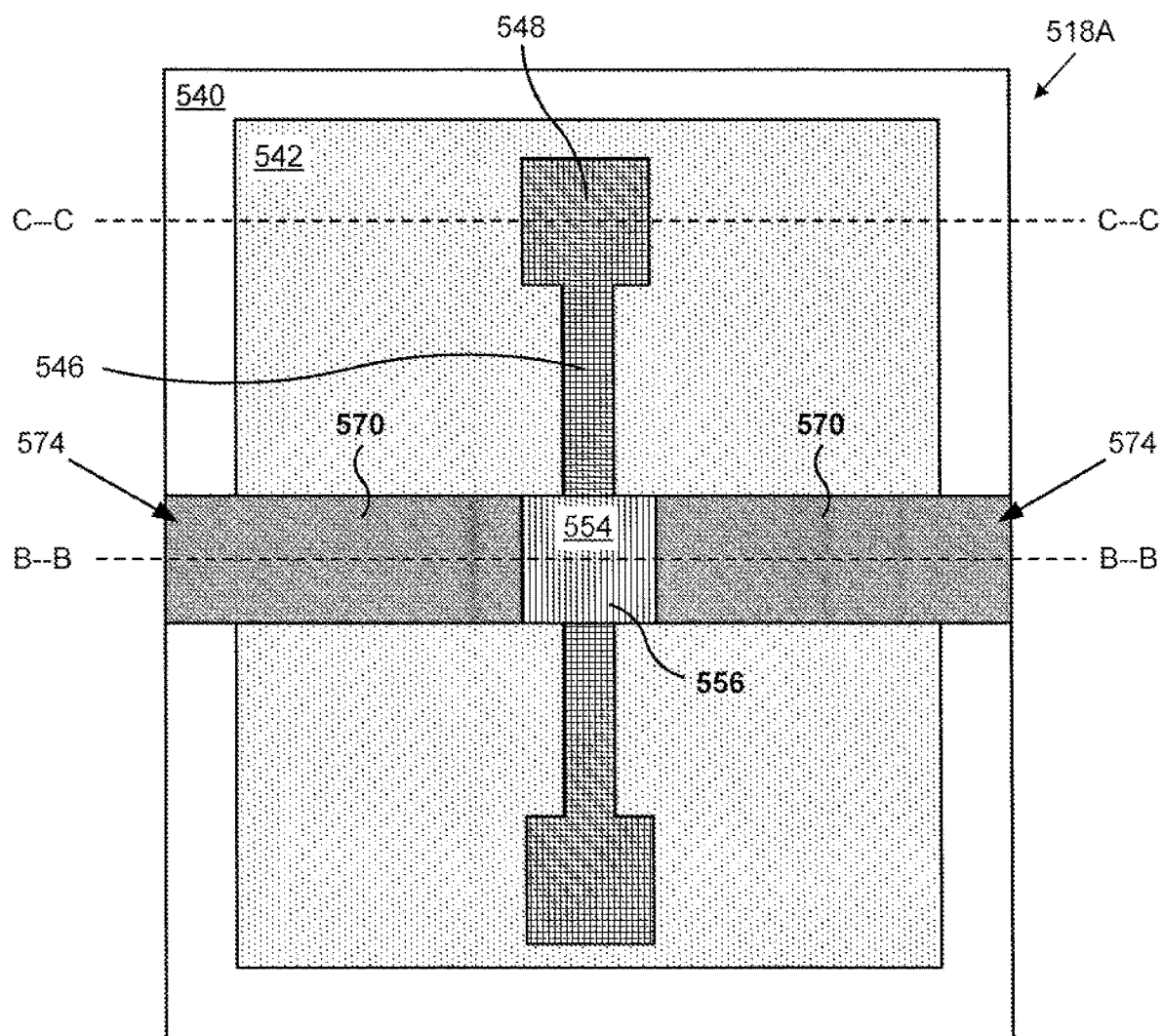
FIG. 5A illustrates a top view of a portion of a PCM RF switch structure processed in accordance with an action in the flowchart of FIG. 1A according to one implementation of the present application.

Referring to FIG. 5A, PCM RF switch structure 518A illustrates a top view of a portion of a PCM RF switch structure processed in accordance with action 118 in flowchart 100A of FIG. 1A according to one implementation of the present application. As shown in FIG. 5A, PCM RF switch structure 518A includes substrate 540, heat spreader 542, heating element 546 having terminal segments 548, PCM 554 having active segment 556, and PCM contacts 574 having upper portions 570. For purposes of illustration, the top view in FIG. 5A shows selected structures of PCM RF switch structure 518A. PCM RF switch structure 518A may include other structures not shown in FIG. 5A. Notably, in Figure SA, upper portions 570 of PCM contacts 574 are formed from lower interconnect metal 464 (shown in FIG. 4A).

Figure 5B:
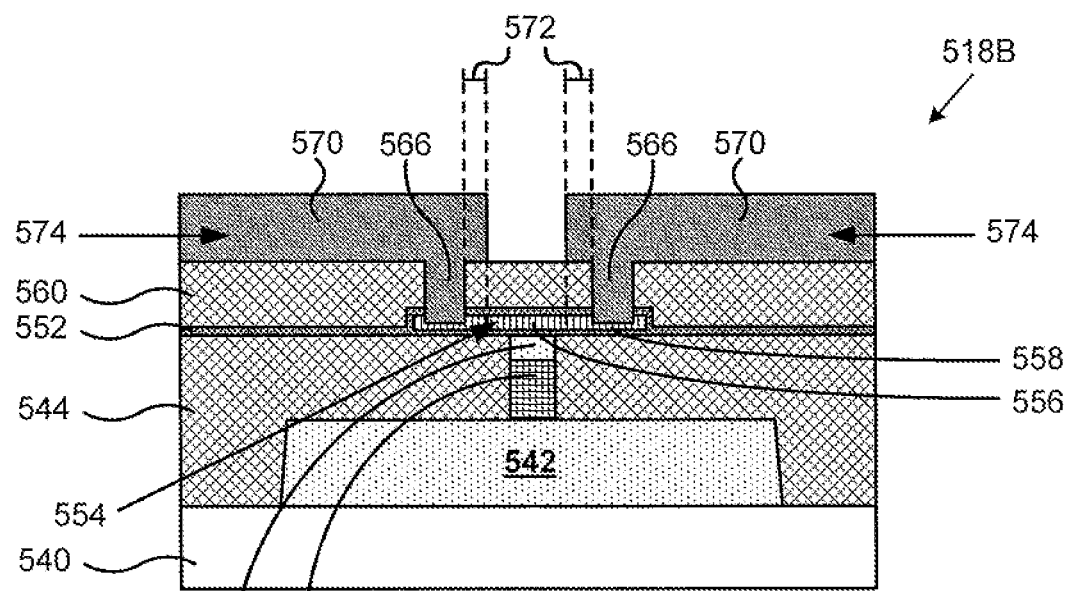
FIGS. 5B and 5C each illustrate a cross-sectional view of a portion of a PCM RF switch structure processed in accordance with an action in the flowchart of FIG. 1A according to one implementation of the present application.

Referring to FIG. 5B, PCM RF switch structure 518B illustrates a cross-sectional view of a portion of a PCM RF switch structure processed in accordance with action 118 in flowchart 100A of FIG. 1A according to one implementation of the present application. FIG. 5B represents a cross-sectional view along line "B-B" in Figure SA. As shown in Figure SB, PCM RF switch structure 518B includes substrate 540, heat spreader 542, lower dielectric 544, heating element 546, nugget 550, combined layer 552, PCM 554 having active segment 556 and passive segments 558, contact dielectric 560, and PCM contacts 574 having lower portions 566 and upper portions 570. Substrate 540, heat spreader 542, lower dielectric 544, heating element 546, nugget 550, combined layer 552, PCM 554 having active segment 556 and passive segments 558, and contact dielectric 560 in FIG. 5B may have any implementations and advantages described above.

As shown in FIG. 5B, lower interconnect metal 464 (shown in FIG. 4B) has been patterned, thereby forming upper portions 570 of PCM contacts 574. Further, as shown in FIG. 5B, upper portions 570 of PCM contacts 574 have offsets 572 towards active segment 556 of PCM 554. Because forming upper portions 570 of PCM contacts 574 shown in FIG. 5B uses a single metal deposition and a single metal etch, manufacturing is simplified. However, where a single metal deposition is used, patterning upper portions 570 of PCM contacts 574 directly aligned with lower portions 566 of PCM contacts 574 presents manufacturing difficulty. In particular, lower interconnect metal 464 (shown in FIG. 4B) can have indents in the vicinity of lower portions 566 of PCM contacts 574, and the manufacturing techniques used to pattern lower interconnect metal 464 (shown in FIG. 4B) can exhibit alignment variations, which can result in upper portions 570 of PCM contacts 574 being misaligned, and thus, the $R_{ON}$ of an RF switch being higher than desired. Offsets 572 towards active segment 556 of PCM 554 protect against these variations and keep $R_{ON}$ low.

Figure 5C:
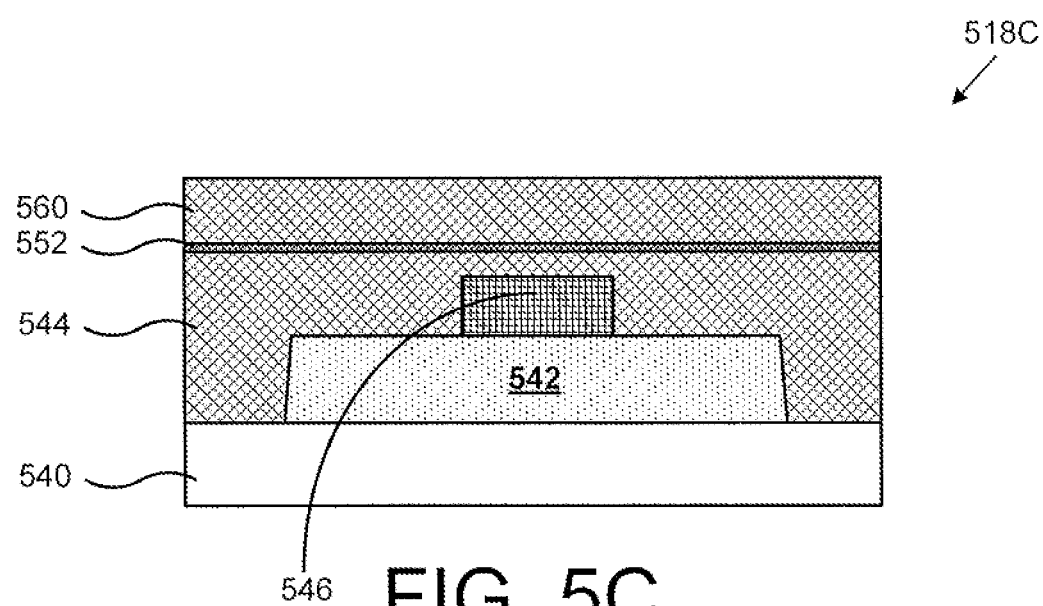

Referring to FIG. 5C, PCM RF switch structure 518C illustrates a cross-sectional view of a portion of a PCM RF switch structure processed in accordance with action 118 in flowchart 100A of FIG. 1A according to one implementation of the present application. FIG. 5C represents a cross-sectional view along line "C-C" in FIG. 5A. As shown in FIG. 5C, PCM RF switch structure 518C includes substrate 540, heat spreader 542, lower dielectric 544, heating element 546, combined layer 552, and contact dielectric 560. Substrate 540, heat spreader 542, lower dielectric 544, heating element 546, combined layer 552, and contact dielectric 560 in FIG. 5C may have any implementations and advantages described above. Notably, the cross-sectional view of PCM RF switch structure 518C in FIG. 5C does not include PCM contacts 574, because line "C-C" in FIG. 5A lies along terminal segment 548 of heating element 546, which extends outward and is transverse to PCM 554.

Figure 6A:
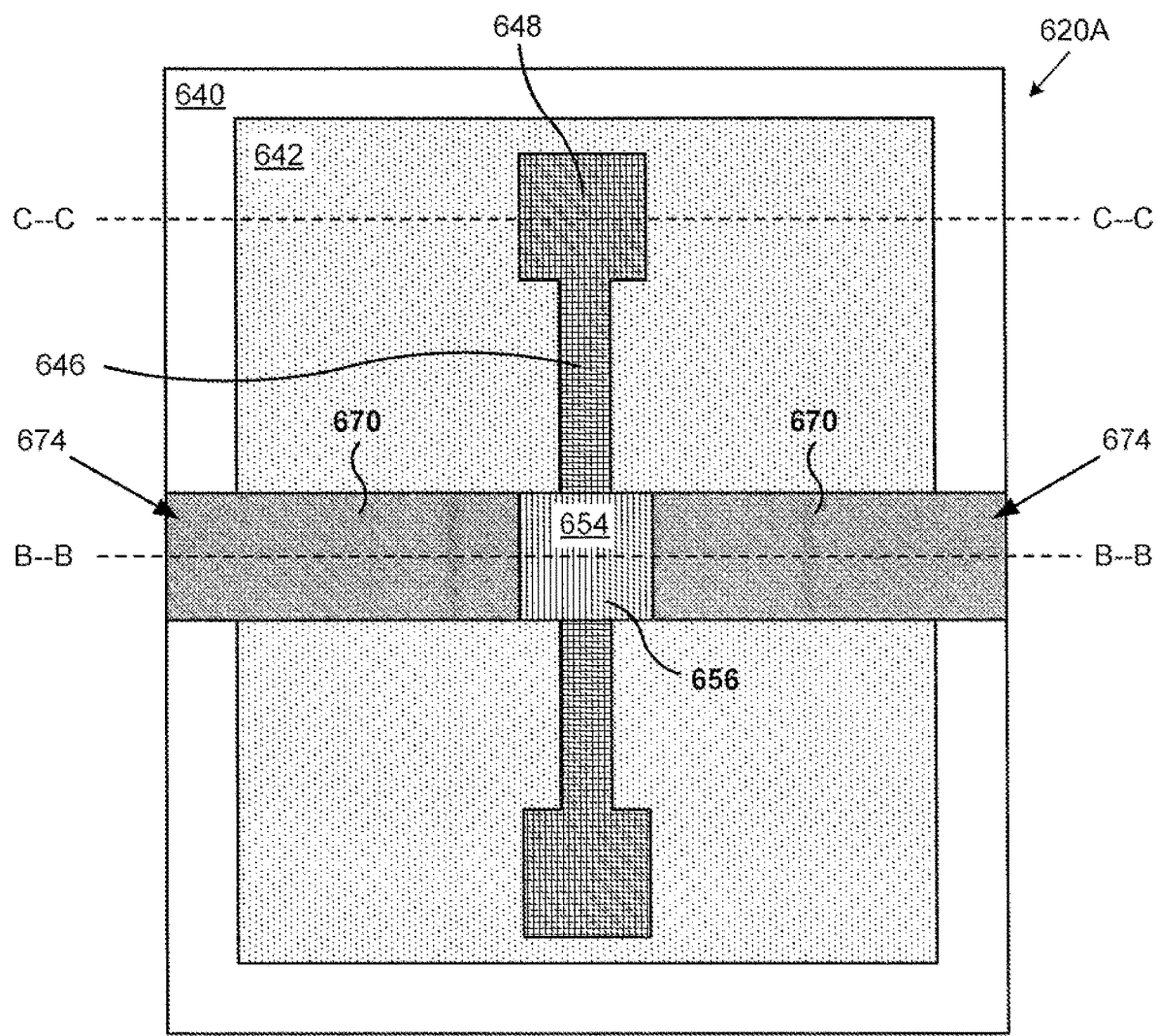
FIG. 6A illustrates a top view of a portion of a PCM RF switch structure processed in accordance with an action in the flowchart of FIG. 1A according to one implementation of the present application.

Referring to FIG. 6A, PCM RF switch structure 620A illustrates a top view of a portion of a PCM RF switch structure processed in accordance with action 120 in flowchart 100A of FIG. 1A according to one implementation of the present application. As shown in FIG. 6A, PCM RF switch structure 620A includes substrate 640, heat spreader 642, heating element 646 having terminal segments 648, PCM 654 having active segment 656, and PCM contacts 674 having upper portions 670. For purposes of illustration, the top view in FIG. 6A shows selected structures of PCM RF switch structure 620A. PCM RF switch structure 620A may include other structures not shown in FIG. 6A. Notably, in FIG. 6A, a layer of interconnect dielectric 676 (shown in FIG. 6B) has been deposited.

Figure 6B:
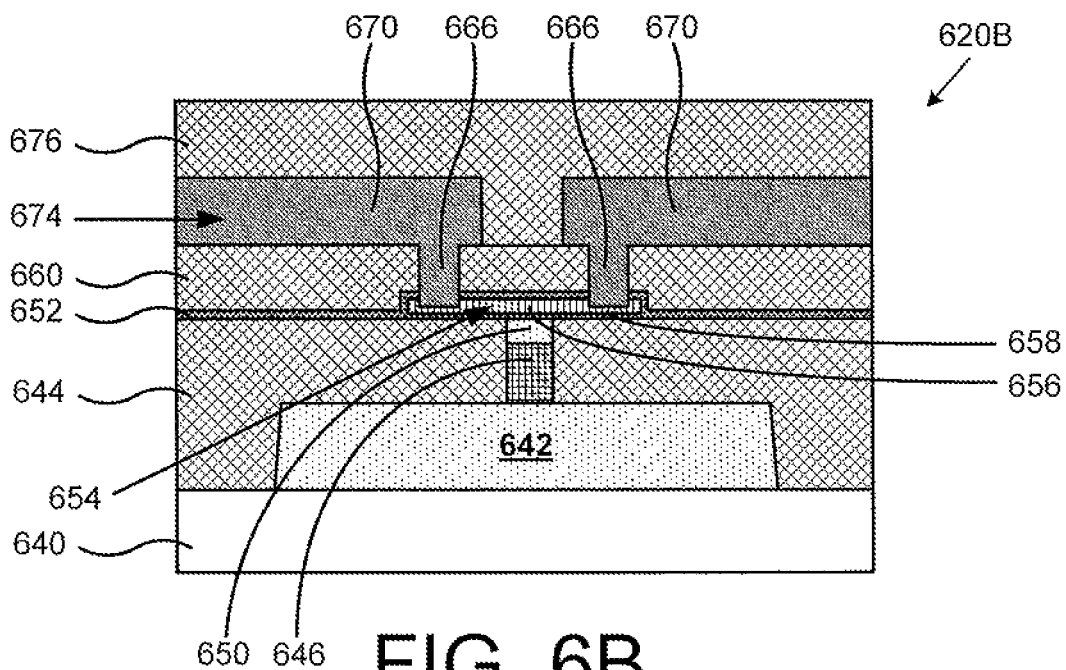
FIGS. 6B and 6C each illustrate a cross-sectional view of a portion of a PCM RF switch structure processed in accordance with an action in the flowchart of FIG. 1A according to one implementation of the present application.

Referring to FIG. 6B, PCM RF switch structure 620B illustrates a cross-sectional view of a portion of a PCM RF switch structure processed in accordance with action 120 in flowchart 100A of FIG. 1A according to one implementation of the present application. FIG. 6B represents a cross-sectional view along line "B-B" in FIG. 6A. As shown in FIG. 6B, PCM RF switch structure 620B includes substrate 640, heat spreader 642, lower dielectric 644, heating element 646, nugget 650, combined layer 652, PCM 654 having active segment 656 and passive segments 658, contact dielectric 660, PCM contacts 674 having lower portions 666 and upper portions 670, and interconnect dielectric 676. Substrate 640, heat spreader 642, lower dielectric 644, heating element 646, nugget 650, combined layer 652, PCM 654 having active segment 656 and passive segments 658, contact dielectric 660, and PCM contacts 674 having lower portions 666 and upper portions 670 in FIG. 6B may have any implementations and advantages described above.

As shown in FIG. 68, a layer of interconnect dielectric 676 is deposited over PCM contacts 674 and over contact dielectric 660, and then planarized. In one implementation, contact dielectric 660 is $SiO_2$. In other implementations, contact dielectric 660 is $Si_xN_y$, or another dielectric.

Figure 6C:
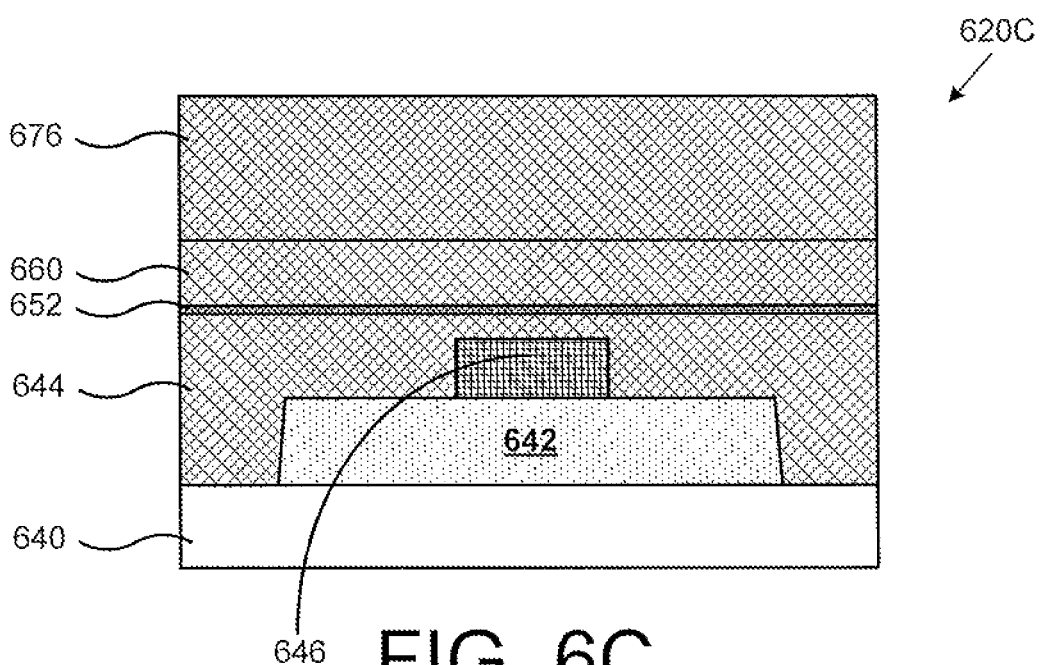

Referring to FIG. 6C, PCM RF switch structure 620C illustrates a cross-sectional view of a portion of a PCM RF switch structure processed in accordance with action 120 in flowchart 100A of FIG. 1A according to one implementation of the present application. FIG. 6C represents a cross-sectional view along line "C-C" in FIG. 6A. As shown in FIG. 6C, PCM RF switch structure 620C includes substrate 640, heat spreader 642, lower dielectric 644, heating element 646, combined layer 652, contact dielectric 660, and interconnect dielectric 676. Substrate 640, heat spreader 642, lower dielectric 644, heating element 646, combined layer 652, contact dielectric 660, and interconnect dielectric 676 in FIG. 6C may have any implementations and advantages described above. Notably, the cross-sectional view of PCM RF switch structure 620C in FIG. 6C does not include PCM contacts 674, because line "C-C" in FIG. 6A lies along terminal segment 648 of heating element 646, which extends outward and is transverse to PCM 654.

FIG. 1B illustrates the remaining portion of the flowchart of Figure A illustrating an exemplary method for manufacturing contacts in a PCM RF switch according to one implementation of the present application. Certain details and features have been left out of the flowchart that are apparent to a person of ordinary skill in the art. For example, an action may consist of one or more subactions or may involve specialized equipment or materials, as known in the art. Moreover, some actions, such as masking and cleaning actions, are omitted so as not to distract from the illustrated actions. Actions 122 through 128 shown in flowchart 100B of FIG. 1B are sufficient to describe one implementation of the present inventive concepts, other implementations of the present inventive concepts may utilize actions different from those shown in flowchart 100B of FIG. 1B. Moreover, structures shown in FIGS. 7A through 10C illustrate the results of performing actions 122 through 128 in flowchart 100B of FIG. 1B.

By way of overview, and as illustrated in FIG. 1B, flowchart 100B continues with action 122 by etching holes in the interconnect dielectric overlying the upper portions of the PCM contacts. The method continues with action 124 by etching holes in the interconnect dielectric and the contact dielectric overlying terminal segments of the heating element. In one implementation, action 124 can be performed prior to action 122. The method continues with action 126 by depositing a top interconnect metal directly connecting with the terminal segments of the heating element. The method concludes with action 128 by forming heating element contacts "cross-wise" to the PCM contacts.

FIGS. 7A through 10C and illustrate the results of performing actions 122 through 128 of flowchart 100B of FIG. 1B, according to one implementation of the present disclosure. For example, structures 722A, 722B, and 722C, show a PCM RF switch structure after performing action 122, structures 824A, 824B, and 824C show a PCM RF switch structure after performing action 124, and so forth.

Figure 7A:
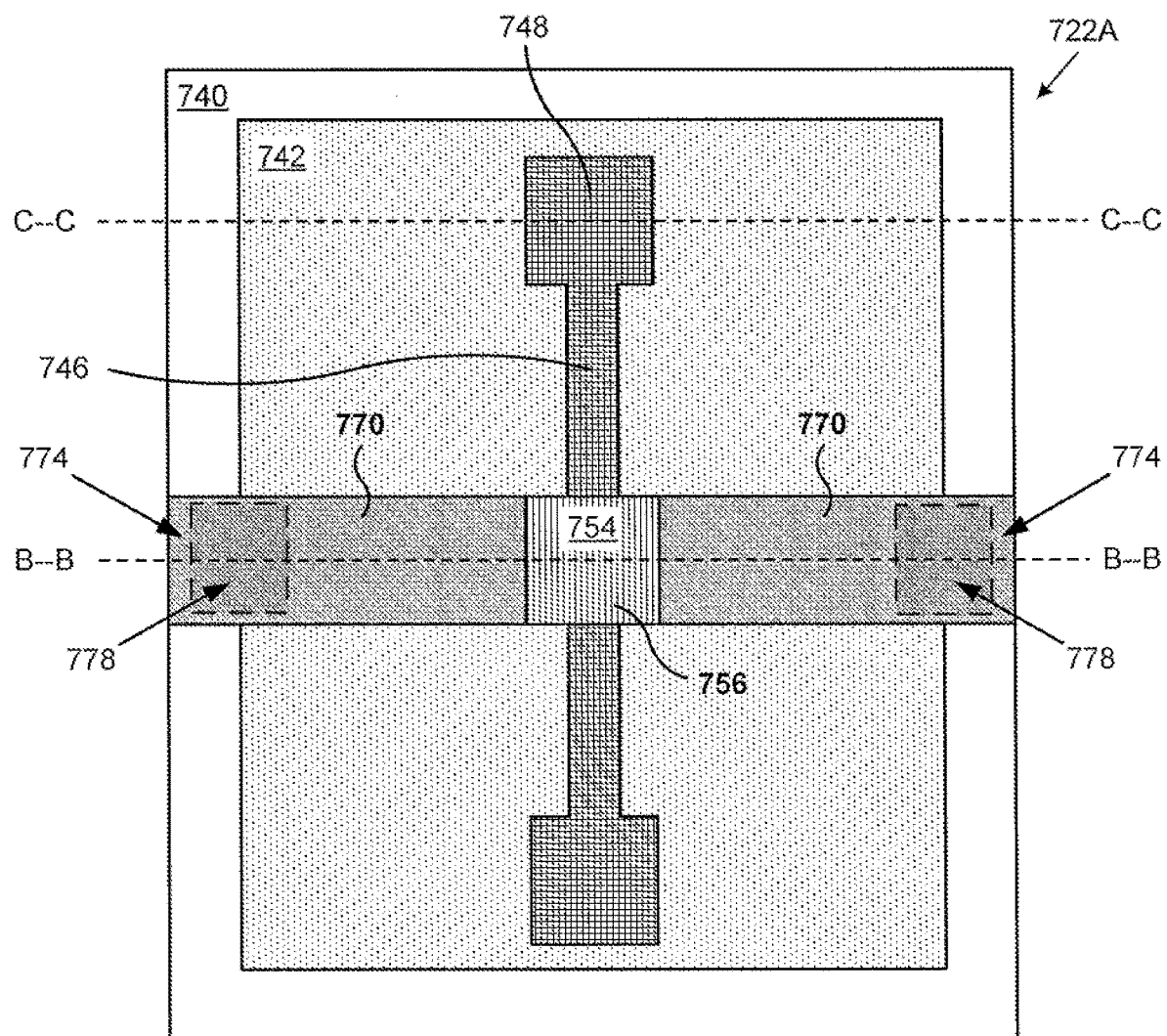
FIG. 7A illustrates a top view of a portion of a PCM RF switch structure processed in accordance with an action in the flowchart of FIG. 1B according to one implementation of the present application.

Referring to FIG. 7A, PCM RF switch structure 722A illustrates a top view of a portion of a PCM RF switch structure processed in accordance with action 122 in flowchart 100B of FIG. 1B according to one implementation of the present application. As shown in FIG. 2B, PCM RF switch structure 722A includes substrate 740, heat spreader 742, heating element 746 having terminal segments 748, PCM 754 having active segment 756, PCM contacts 774 having upper portions 770, and holes 778. For purposes of illustration, the top view in FIG. 7A shows selected structures of PCM RF switch structure 722A. PCM RF switch structure 722A may include other structures not shown in FIG. 7A. Notably, in FIG. 7A, holes 778 (shown with dashed lines) are etched in interconnect dielectric 776 (shown in FIG. 7B) overlying upper portions 770 of PCM contacts 774.

Figure 7B:
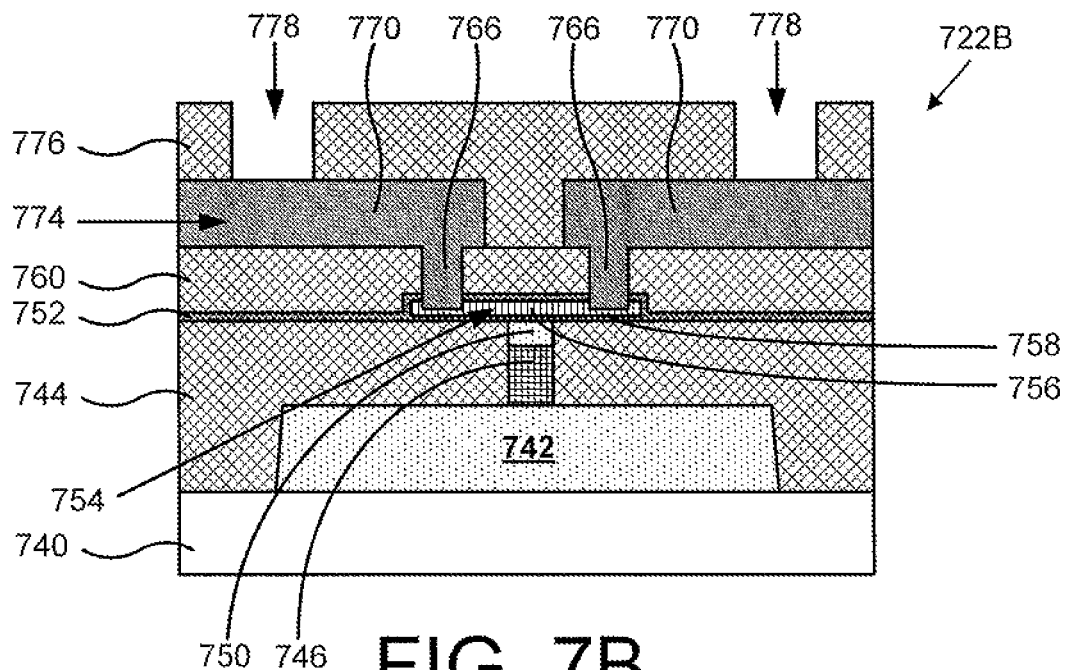
FIGS. 7B and 7C each illustrate a cross-sectional view of a portion of a PCM RF switch structure processed in accordance with an action in the flowchart of FIG. 1B according to one implementation of the present application.

Referring to FIG. 7B, PCM RF switch structure 722B illustrates a cross-sectional view of a portion of a PCM RF switch structure processed in accordance with action 122 in flowchart 100B of FIG. 1B according to one implementation of the present application. FIG. 7B represents a cross-sectional view along line "B-B" in FIG. 7A. As shown in FIG. 7B, PCM RF switch structure 722B includes substrate 740, heat spreader 742, lower dielectric 744, heating element 746, nugget 750, combined layer 752, PCM 754 having active segment 756 and passive segments 758, contact dielectric 760, PCM contacts 774 having lower portions 766 and upper portions 770, interconnect dielectric 776, and holes 778. Substrate 740, heat spreader 742, lower dielectric 744, heating element 746, nugget 750, combined layer 752, PCM 754 having active segment 756 and passive segments 758, contact dielectric 760, PCM contacts 774 having lower portions 766 and upper portions 770, and interconnect dielectric 776 in FIG. 7B may have any implementations and advantages described above.

As shown in FIG. 7B, holes 778 are etched through and interconnect dielectric 776 to upper portions 770 of PCM contacts 774. Notably, holes 778 are etched overlying terminal segments of upper portions 770 of PCM contacts 774, away from active segment 756 of PCM 754.

Figure 7C:
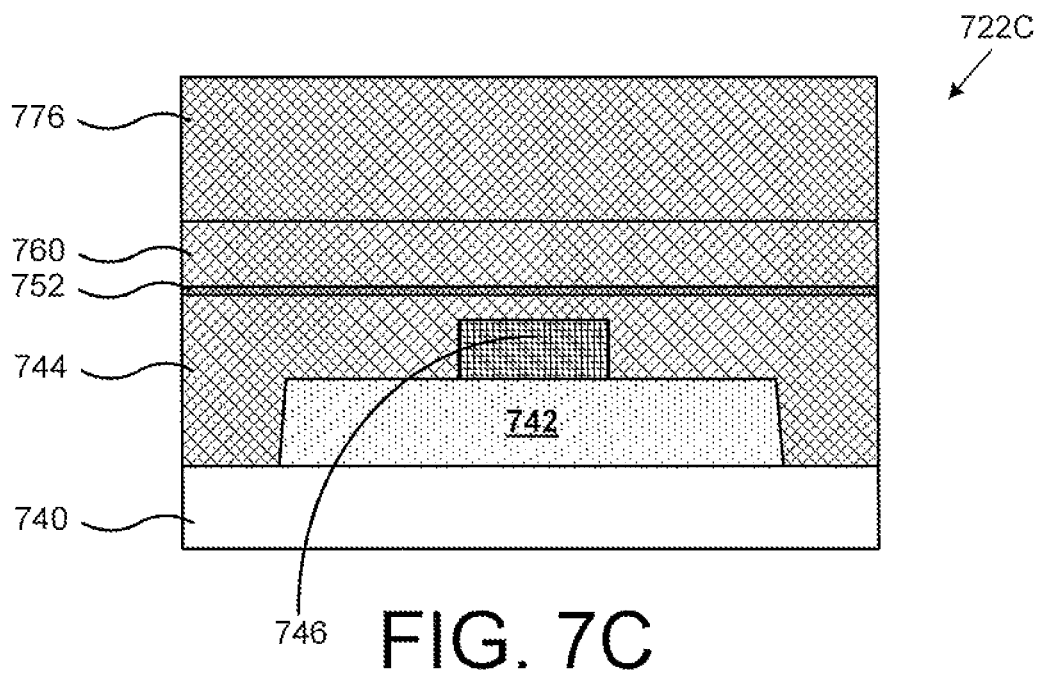

Referring to FIG. 7C, PCM RF switch structure 722C illustrates a cross-sectional view of a portion of a PCM RF switch structure processed in accordance with action 122 in flowchart 100B of FIG. 1B according to one implementation of the present application. FIG. 7C represents a cross-sectional view along line "C-C" in FIG. 7A. As shown in FIG. 7C, PCM RF switch structure 722C includes substrate 740, heat spreader 742, lower dielectric 744, heating element 746, combined layer 752, contact dielectric 760, and interconnect dielectric 776. Substrate 740, heat spreader 742, lower dielectric 744, heating element 746, combined layer 752, contact dielectric 760, and interconnect dielectric 776 in FIG. 7C may have any implementations and advantages described above. Notably, the cross-sectional view of PCM RF switch structure 722C in FIG. 7C does not include holes 778 in interconnect dielectric 776 overlying upper portions 770 of PCM contacts 774, because line "C-C" in FIG. 7A lies along terminal segment 748 of heating element 746, which extends outward and is transverse to PCM 754, and also because analogous holes have not been etched in interconnect dielectric 776 overlying terminal segments 748 of heating element 746. As shown in FIG. 7A, holes are etched overlying upper portions 770 of PCM contacts 774, but not overlying terminal segments 748 of heating element 746.

Figure 8A:
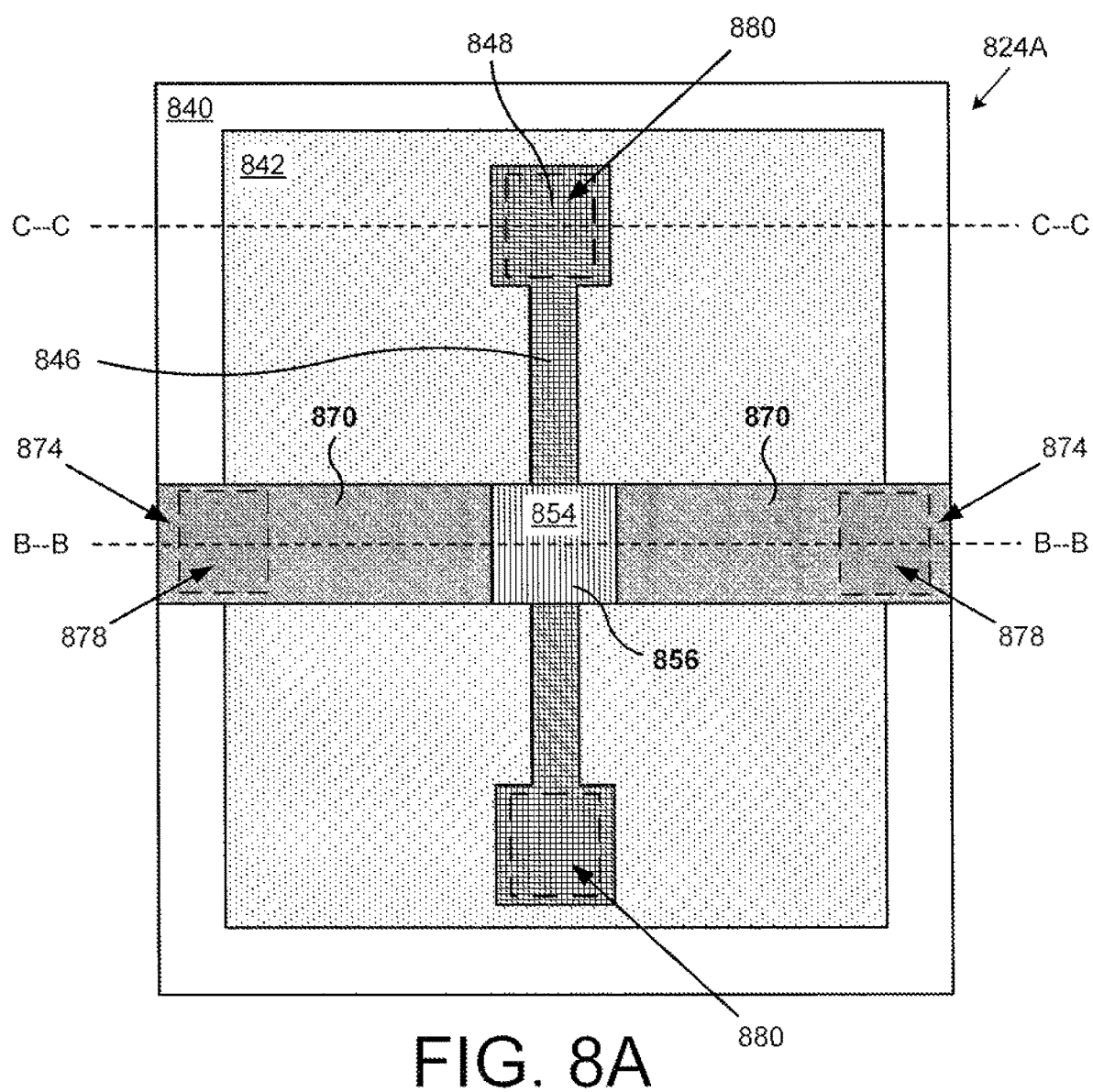
FIG. 8A illustrates a top view of a portion of a PCM RF switch structure processed in accordance with an action in the flowchart of FIG. 1B according to one implementation of the present application.

Referring to FIG. 8A, PCM RF switch structure 824A illustrates a top view of a portion of a PCM RF switch structure processed in accordance with action 124 in flowchart 100B of FIG. 1B according to one implementation of the present application. As shown in FIG. 8A, PCM RF switch structure 824A includes substrate 840, heat spreader 842, heating element 846 having terminal segments 848, PCM 854 having active segment 856, PCM contacts 874 having upper portions 870, holes 878, and holes 880. For purposes of illustration, the top view in FIG. 8A shows selected structures of PCM RF switch structure 824A. PCM RF switch structure 824A may include other structures not shown in FIG. 8A. Notably, in FIG. 8A, holes 880 (shown with dashed lines) are etched in interconnect dielectric 876 (shown in FIG. 8C), contact dielectric 860 (shown in FIG. 8C), combined layer 852 (in case combined layer 852 is used; shown in FIG. 8C), and lower dielectric 844 (shown in FIG. 8C) overlying terminal segments 848 of heating element 846.

Figure 8B:
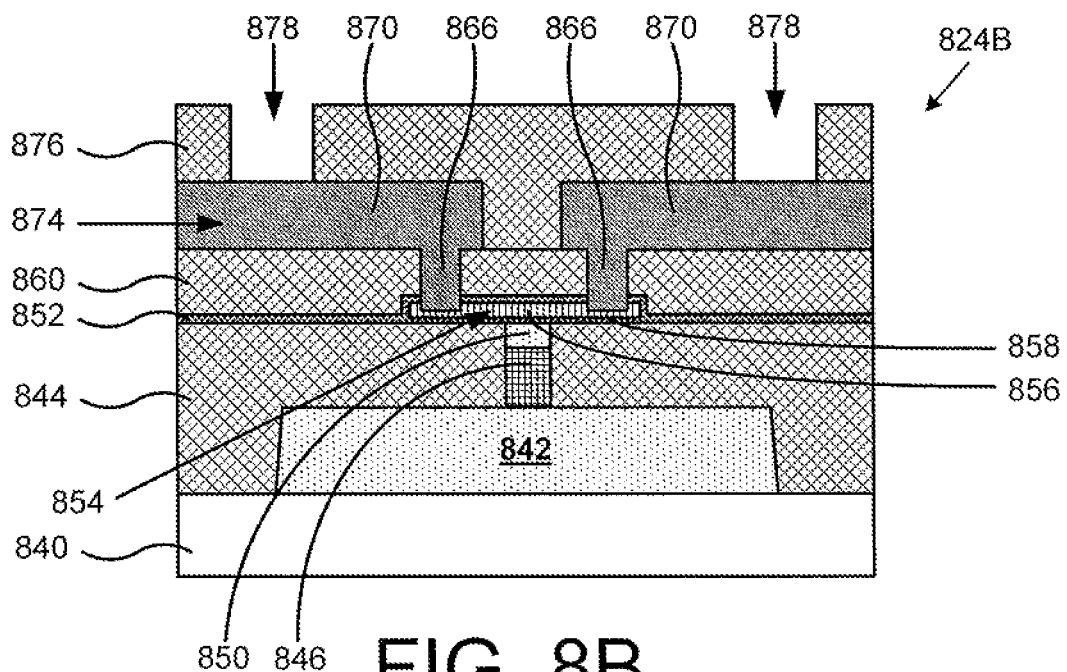
FIGS. 8B and 8C each illustrate a cross-sectional view of a portion of a PCM RF switch structure processed in accordance with an action in the flowchart of FIG. 1B according to one implementation of the present application.

Referring to FIG. 8B, PCM RF switch structure 824B illustrates a cross-sectional view of a portion of a PCM RF switch structure processed in accordance with action 124 in flowchart 100B of FIG. 1B according to one implementation of the present application. FIG. 8B represents a cross-sectional view along line "B-B" in FIG. 8A. As shown in FIG. 8B, PCM RF switch structure 824B includes substrate 840, heat spreader 842, lower dielectric 844, heating element 846, nugget 850, combined layer 852, PCM 854 having active segment 856 and passive segments 858, contact dielectric 860, PCM contacts 874 having lower portions 866 and upper portions 870, interconnect dielectric 876, and holes 878. Substrate 840, heat spreader 842, lower dielectric 844, heating element 846, nugget 850, combined layer 852, PCM 854 having active segment 856 and passive segments 858, contact dielectric 860, PCM contacts 874 having lower portions 866 and upper portions 870, interconnect dielectric 876, and holes 878 in FIG. 8B may have any implementations and advantages described above. Notably, the cross-sectional view of PCM RF switch structure 824B in FIG. 8B does not include holes 880 (shown in FIG. 8C) in interconnect dielectric 876 and in contact dielectric 860 overlying terminal segments of heating element 846, because line "B-B" in FIG. 8A lies along PCM 854. As shown in FIG. 8A, holes 880 are etched overlying terminal segments 848 of heating element 846, whereas holes 878 are separately etched overlying terminal segments of upper portions 870 of PCM contacts 874.

Figure 8C:
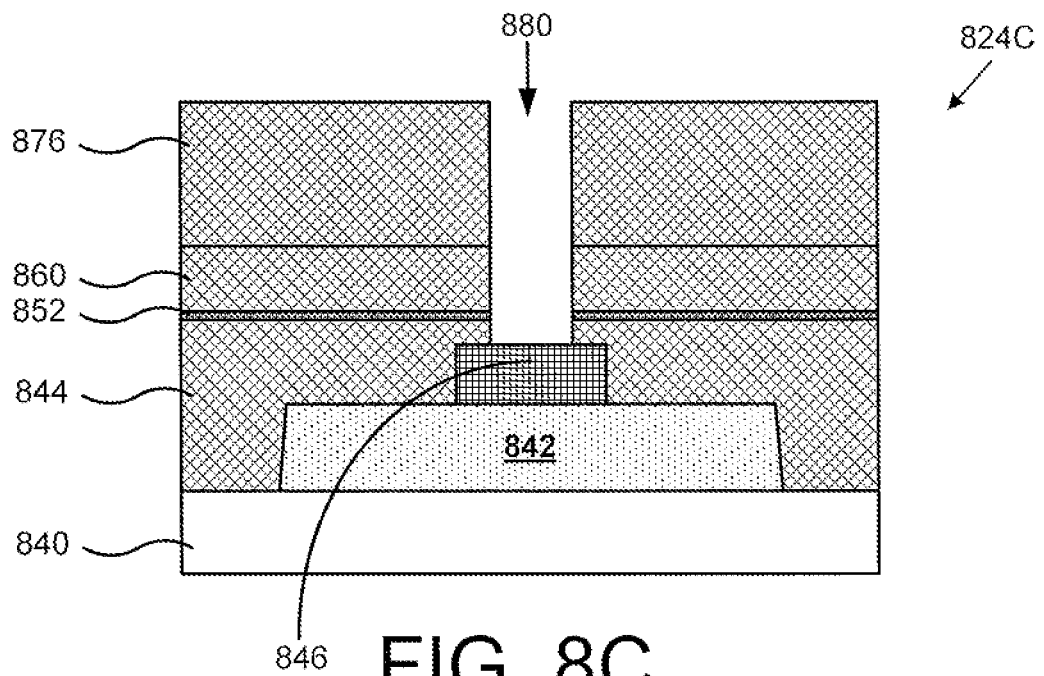

Referring to FIG. 8C, PCM RF switch structure 824C illustrates a cross-sectional view of a portion of a PCM RF switch structure processed in accordance with action 124 in flowchart 100B of FIG. 1B according to one implementation of the present application. FIG. 8C represents a cross-sectional view along line "C-C" in FIG. 8A. As shown in FIG. 8C, PCM RF switch structure 824C includes substrate 840, heat spreader 842, lower dielectric 844, heating element 846, combined layer 852, contact dielectric 860, interconnect dielectric 876, and hole 880. Substrate 840, heat spreader 842, lower dielectric 844, heating element 846, combined layer 852, contact dielectric 860, and interconnect dielectric 876 in FIG. 8C may have any implementations and advantages described above.

As shown in FIG. 8C, hole 880 is etched through and interconnect dielectric 876, contact dielectric 860, and combined layer 852 (in case combined layer 852 is used), and partially through lower dielectric 844, to heating element 846. In this implementation, action 124 for etching hole 880 in interconnect dielectric 876 and contact dielectric 860 overlying terminal segments of heating element 846 may comprise two different etching actions. In the first etching action, interconnect dielectric 876, and contact dielectric 860 can be etched to form most of hole 880. This first etching action can use a selective etch, for example, a fluorine-based plasma dry etch, and combined layer 852 (in case combined layer 852 is used) can perform as an etch stop while interconnect dielectric 876 and contact dielectric 860 are selectively etched. The second etching action can use a selective etch, for example, a chlorine-based plasma dry etch, and heating element 846 can perform as an etch stop while combined layer 852 (in case combined layer 852 is used) and lower dielectric 844 are selectively etched.

As a result, heating element 846 will remain substantially intact, and uniform contact can be made to heating element 846. Notably, holes 878 (shown in FIG. 8B) and hole 880 (shown in FIG. 8C) did not etch through interconnect dielectric 876 in the same action. Additionally, hole 880 etched through contact dielectric 860, combined layer 852 (in case combined layer 852 is used), and lower dielectric 844. Thus, holes 878 (shown in FIG. 8B) and hole 880 (shown in FIG. 8C) have different depths. Holes 878 (shown in FIG. 8B) reach to upper portions 870 of PCM contacts 874, while hole 880 (shown in FIG. 8C) reaches to heating element 846, which underlies active segment 856 of PCM 854 and extends outward and is transverse to PCM 854. In one implementation, holes 878 have depths of approximately five thousands angstroms (5000 Å), and hole 880 has a depth of approximately two microns (2 μm). In one implementation holes 878 (shown in FIG. 8B) and hole 880 (shown in FIG. 8C) can be etched concurrently, rather than separately.

Figure 9A:
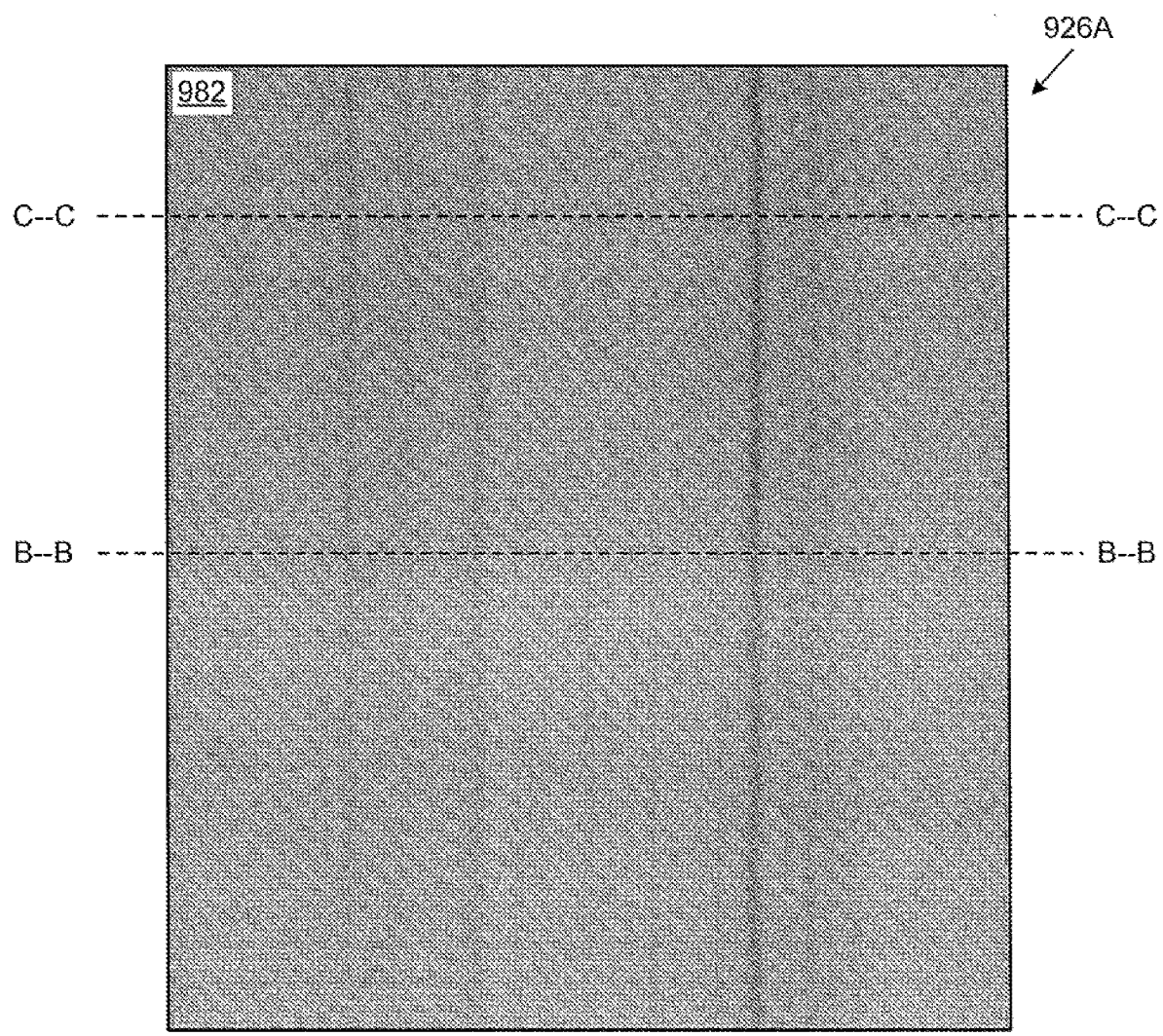
FIG. 9A illustrates a top view of a portion of a PCM RF switch structure processed in accordance with an action in the flowchart of FIG. 1B according to one implementation of the present application.

Referring to FIG. 9A, PCM RF switch structure 926A illustrates a top view of a portion of a PCM RF switch structure processed in accordance with action 126 in flowchart 100B of FIG. 1B according to one implementation of the present application. As shown in FIG. 9A, PCM RF switch structure 926A includes top interconnect metal 982. For purposes of illustration, the top view in FIG. 9A shows selected structures of PCM RF switch structure 926A. PCM RF switch structure 926A may include other structures not shown in FIG. 9A. Notably, in FIG. 9A, top interconnect metal 982 is situated atop PCM RF switch structure 926A, in holes 878 (shown in FIG. 8A), and in holes 880 (shown in FIG. 8A).

Figure 9B:
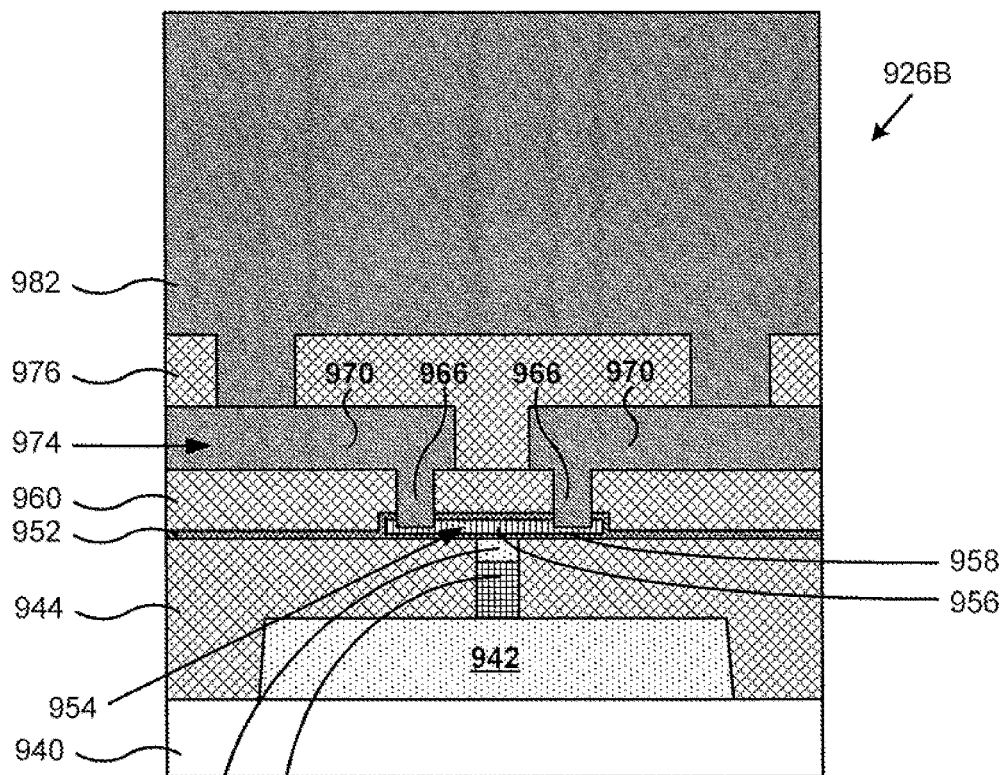
FIGS. 9B and 9C each illustrate a cross-sectional view of a portion of a PCM RF switch structure processed in accordance with an action in the flowchart of FIG. 1B according to one implementation of the present application.

Referring to FIG. 9B, PCM RF switch structure 926B illustrates a cross-sectional view of a portion of a PCM RF switch structure processed in accordance with action 126 in flowchart 100B of FIG. 1B according to one implementation of the present application. FIG. 9B represents a cross-sectional view along line "B-B" in FIG. 9A. As shown in FIG. 9B, PCM RF switch structure 926B includes substrate 940, heat spreader 942, lower dielectric 944, heating element 946, nugget 950, combined layer 952, PCM 954 having active segment 956 and passive segments 958, contact dielectric 960, PCM contacts 974 having lower portions 966 and upper portions 970, interconnect dielectric 976, and top interconnect metal 982. Substrate 940, heat spreader 942, lower dielectric 944, heating element 946, nugget 950, combined layer 952, PCM 954 having active segment 956 and passive segments 958, contact dielectric 960, PCM contacts 974 having lower portions 966 and upper portions 970, and interconnect dielectric 976 in FIG. 9B may have any implementations and advantages described above.

As shown in FIG. 9B, top interconnect metal 982 is deposited in holes 878 (shown in FIG. 8B) and over interconnect dielectric 976. Top interconnect metal 982 is connected to upper portions 970 and forms a top interconnect of PCM contacts 974. In various implementations, top interconnect metal 982 can comprise W, Cu, or Al. In one implementation, the top surface of top interconnect metal 982 can have indents in the vicinity of in holes 878 (shown in FIG. 8B).

Figure 9C:
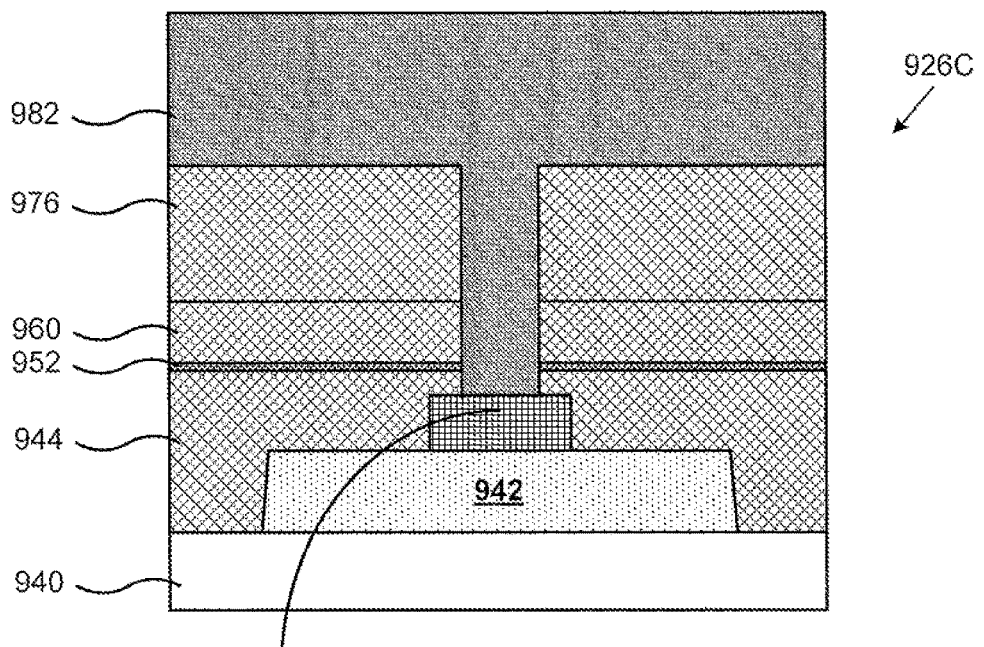

Referring to FIG. 9C, PCM RF switch structure 926C illustrates a cross-sectional view of a portion of a PCM RF switch structure processed in accordance with action 126 in flowchart 100B of FIG. 1B according to one implementation of the present application. FIG. 9C represents a cross-sectional view along line "C-C" in FIG. 9A. As shown in FIG. 9C, PCM RF switch structure 926C includes substrate 940, heat spreader 942, lower dielectric 944, heating element 946, combined layer 952, contact dielectric 960, interconnect dielectric 976, and top interconnect metal 982. Substrate 940, heat spreader 942, lower dielectric 944, heating element 946, combined layer 952, contact dielectric 960, and interconnect dielectric 976 in FIG. 9C may have any implementations and advantages described above.

As shown in FIG. 9C, top interconnect metal 982 is deposited in holes 880 (shown in FIG. 8C) and over interconnect dielectric 976. Top interconnect metal 982 is connected to terminal segments of heating element 946. In one implementation, the top surface of top interconnect metal 982 can have indents in the vicinity of in hole 880 (shown in FIG. 8C).

Figure 10A:
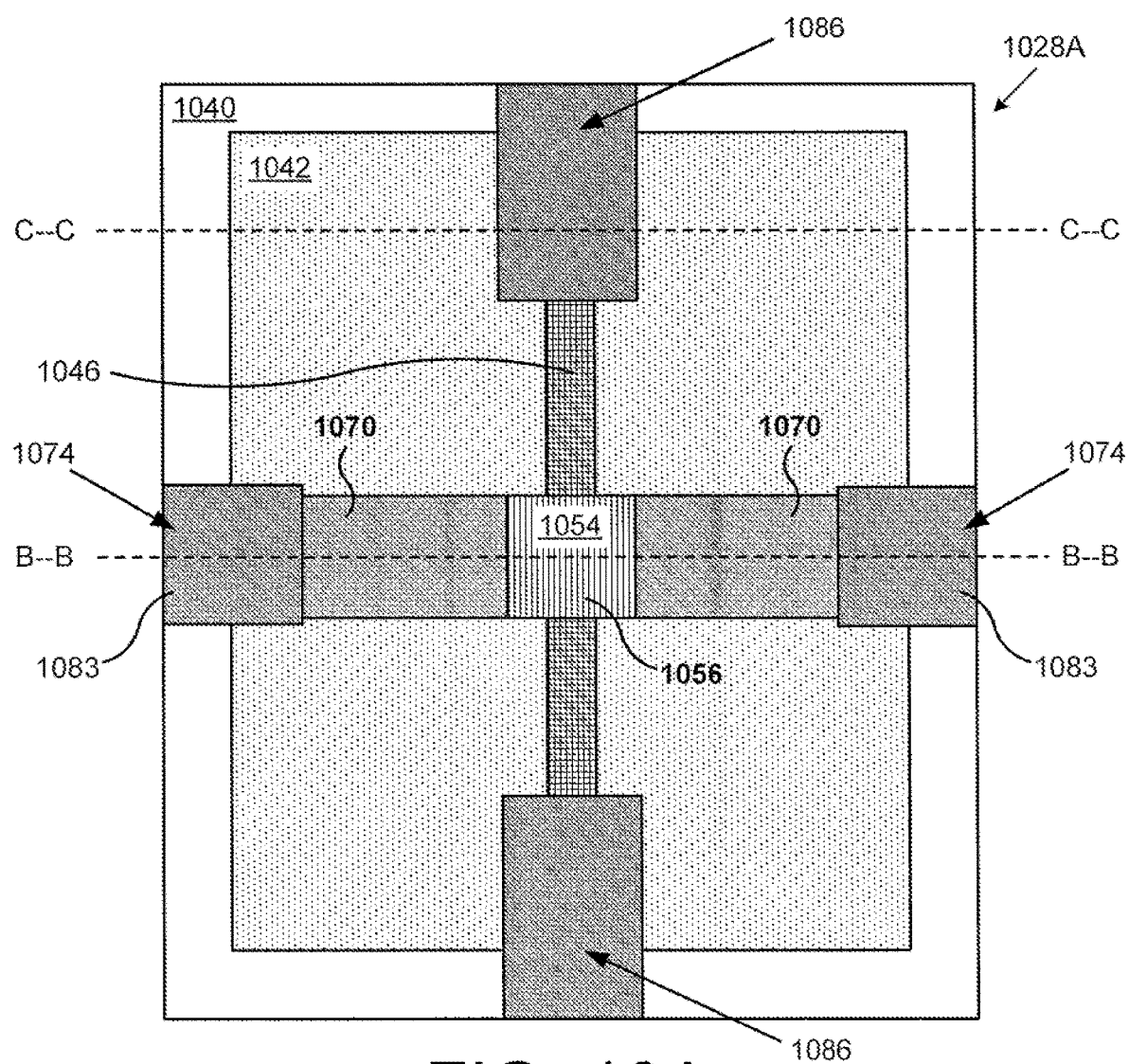
FIG. 10A illustrates a top view of a portion of a PCM RF switch structure processed in accordance with an action in the flowchart of FIG. 1B according to one implementation of the present application.

Referring to FIG. 10A, PCM RF switch structure 1028A illustrates a top view of a portion of a PCM RF switch structure processed in accordance with action 128 in flowchart 100B of FIG. 1B according to one implementation of the present application. As shown in FIG. 10A, PCM RF switch structure 1028A includes substrate 1040, heat spreader 1042, heating element 1046, PCM 1054 having active segment 1056, PCM contacts 1074 having upper portions 1070 and top interconnects 1083, and heating element contacts 1086. For purposes of illustration, the top view in FIG. 10A shows selected structures of PCM RF switch structure 1028A. PCM RF switch structure 1028A may include other structures not shown in FIG. 10A. Notably, in FIG. 10A, top interconnect metal 982 (shown in FIG. 9A) has been patterned. As a result, heating element contacts 1086 are formed cross-wise to PCM contacts 1074. As used herein, "cross-wise" refers to the fact that PCM contacts 1074 are not situated in the same row or in the same column as heating element contacts 1086.

Figure 10B:
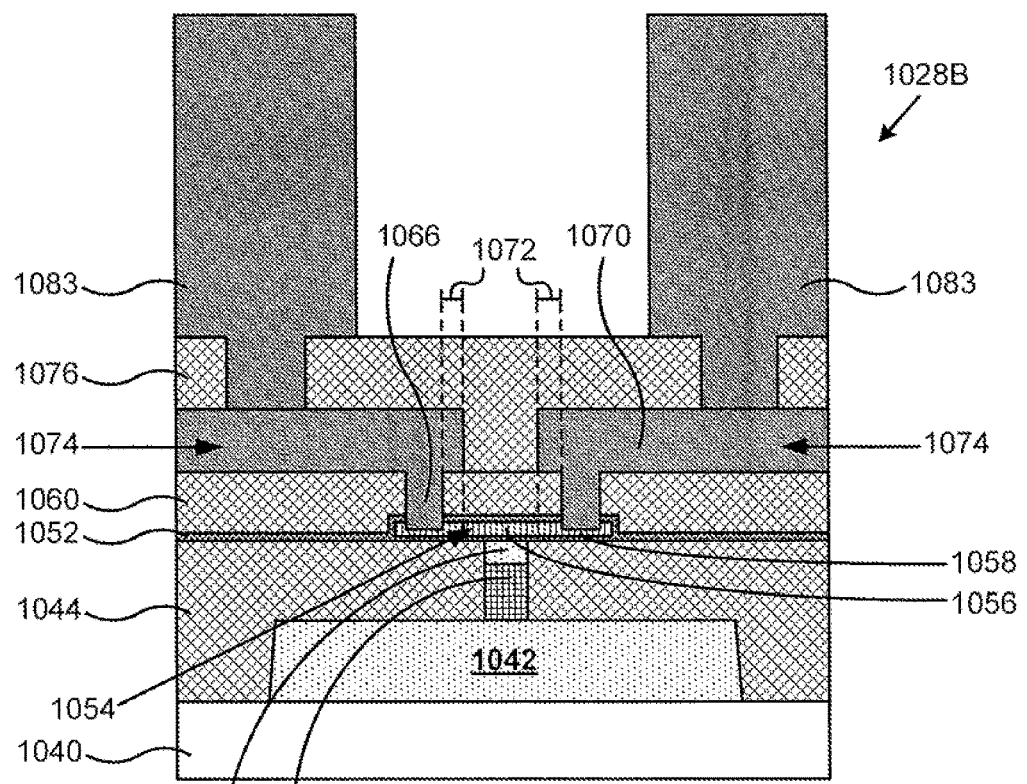
FIGS. 10B and 10C each illustrate a cross-sectional view of a portion of a PCM RF switch structure processed in accordance with an action in the flowchart of FIG. 1B according to one implementation of the present application.

Referring to FIG. 10B, PCM RF switch structure 1028B illustrates a cross-sectional view of a portion of a PCM RF switch structure processed in accordance with action 128 in flowchart 100B of FIG. 1B according to one implementation of the present application. FIG. 10B represents a cross-sectional view along line "B-B" in FIG. 10A. As shown in FIG. 10B, PCM RF switch structure 1028B includes substrate 1040, heat spreader 1042, lower dielectric 1044, heating element 1046, nugget 1050, combined layer 1052, PCM 1054 having active segment 1056 and passive segments 1058, contact dielectric 1060, PCM contacts 1074 having lower portions 1066, upper portions 1070 with offset 1072, and top interconnect 1082, and interconnect dielectric 1076. Substrate 1040, heat spreader 1042, lower dielectric 1044, heating element 1046, nugget 1050, combined layer 1052, PCM 1054 having active segment 1056 and passive segments 1058, contact dielectric 1060, PCM contacts 1074 having lower portions 1066, upper portions 1070 with offset 1072, and top interconnects 1083, and interconnect dielectric 1076 in FIG. 10B may have any implementations and advantages described above.

As shown in FIG. 10B, top interconnect metal 982 (shown in FIG. 9B) has been patterned. As a result, top interconnects 1083 of PCM contacts 1074 are formed. Top interconnects 1083 are connected to and substantially overlie terminal segments of upper portions 1070 of PCM contacts 1074.

Figure 10C:
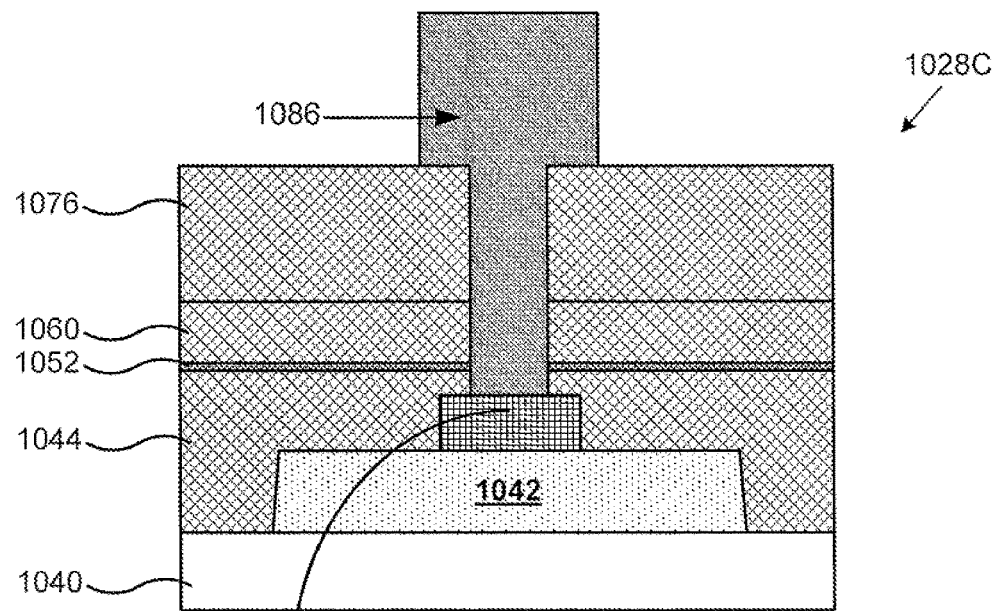

Referring to FIG. 10C, PCM RF switch structure 1028C illustrates a cross-sectional view of a portion of a PCM RF switch structure processed in accordance with action 128 in flowchart 100B of FIG. 1B according to one implementation of the present application. FIG. 10C represents a cross-sectional view along line "C-C" in FIG. 10A. As shown in FIG. 10C, PCM RF switch structure 1028C includes substrate 1040, heat spreader 1042, lower dielectric 1044, heating element 1046, combined layer 1052, contact dielectric 1060, interconnect dielectric 1076, and heating element contact 1086. Substrate 1040, heat spreader 1042, lower dielectric 1044, heating element 1046, combined layer 1052, contact dielectric 1060, and interconnect dielectric 1076 in FIG. 10C may have any implementations and advantages described above.

As shown in FIG. 10C, top interconnect metal 982 (shown in FIG. 9C) has been patterned. As a result, heating element contacts 1086 are formed. Heating element contacts 1086 are connected to and substantially overlie terminal segments of heating element 1046.

PCM RF switch structures 1028A, 1028B, and 1028C in FIGS. 10A, 10B, and 10C represent a substantially complete PCM RF switch according to one implementation where flowchart 100A in FIG. 1A continues from action 116 to action 118, and where upper portions 1070 of PCM contacts 1074 have offset 1072 towards active segment 1056 of PCM 1054. In another implementation, flowchart 100A in FIG. 1A continues from action 116 (corresponding to FIGS. 4A through 4C) to action 130 (corresponding to FIGS. 11A through 11C), and upper portions of PCM contacts will have an offset away from the active segment of the PCM. FIGS. 11A through 14C illustrate the results of performing actions 130 through 136 of flowchart 100A of FIG. 1A, according to one alternative implementation of the present disclosure. For example, structures 1130A, 1130B, and 1130C, show a PCM RF switch structure after performing action 130, structures 1232A, 1232B, and 1232C show a PCM RF switch structure after performing action 132, and so forth.

Figure 11A:
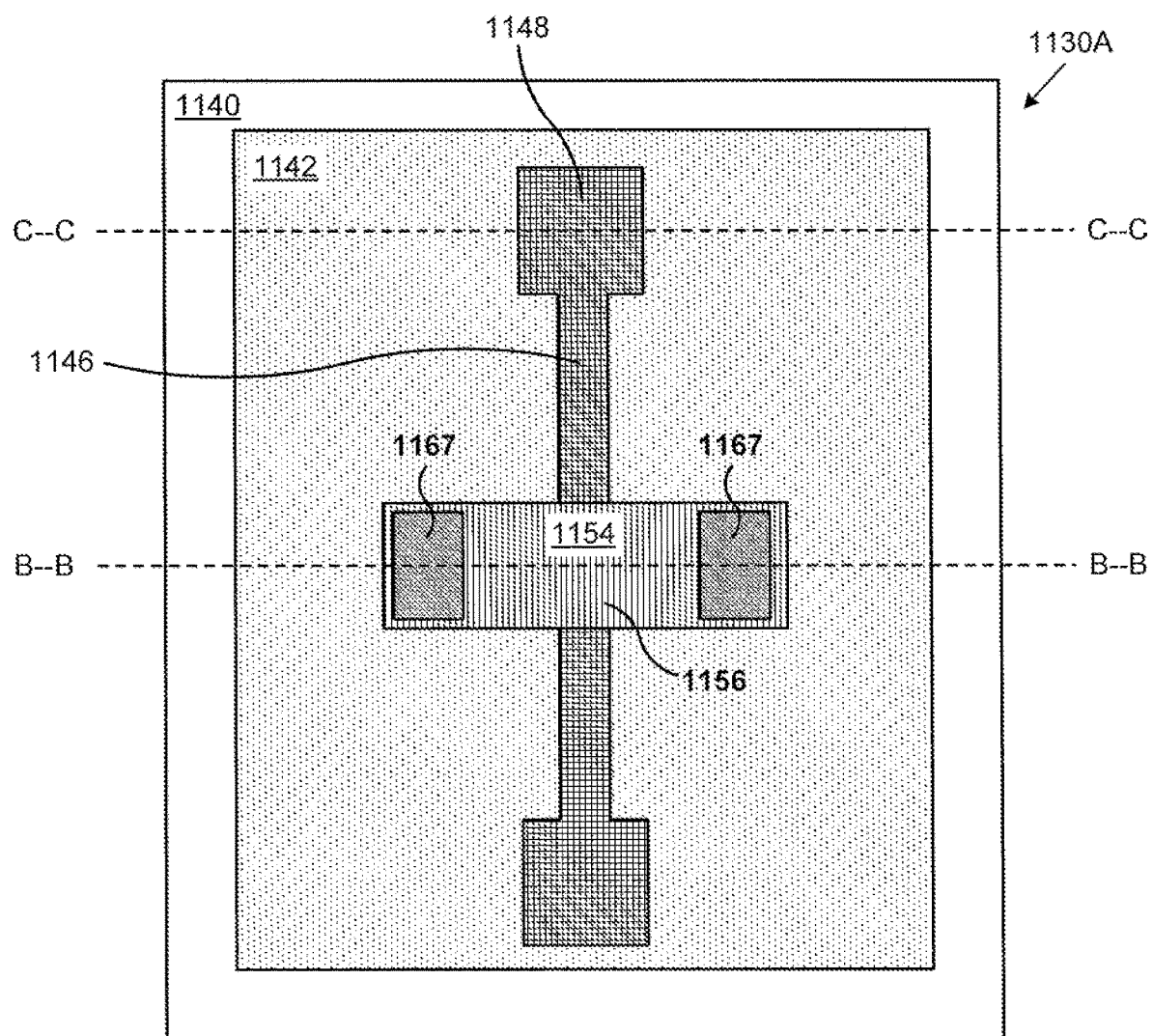
FIG. 11A illustrates a top view of a portion of a PCM RF switch structure processed in accordance with an action in the flowchart of FIG. 1A according to one implementation of the present application.

Referring to FIG. 11A, PCM RF switch structure 1130A illustrates a top view of a portion of a PCM RF switch structure processed in accordance with action 130 in flowchart 100A of FIG. 1A according to one implementation of the present application. As shown in FIG. 11A, PCM RF switch structure 1130A includes substrate 1140, heat spreader 1142, heating element 1146 having terminal segments 1148, PCM 1154 having active segment 1156, and lower portions 1167 of PCM contacts. For purposes of illustration, the top view in FIG. 11A shows selected structures of PCM RF switch structure 1130A. PCM RF switch structure 1130A may include other structures not shown in FIG. 11A. Notably, in FIG. 11A, portions of lower interconnect metal 464 (shown in FIG. 4A) have been removed, leaving lower portions 1167 of PCM contacts in holes 362 (shown in FIG. 3A) connected to passive segments of PCM 1154.

Figure 11B:
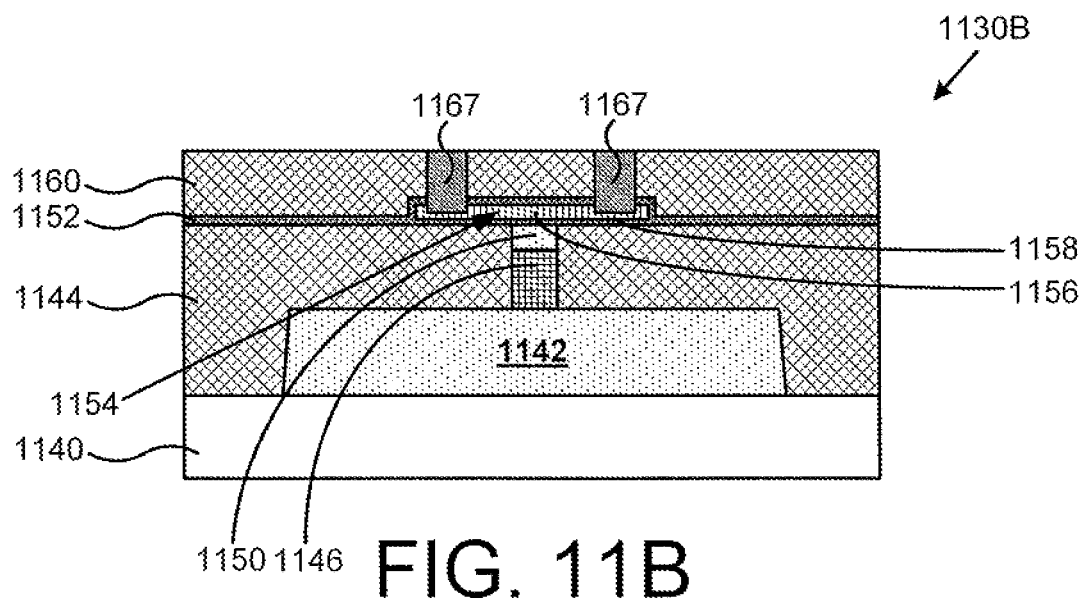
FIGS. 11B and 11C each illustrate a cross-sectional view of a portion of a PCM RF switch structure processed in accordance with an action in the flowchart of FIG. 1A according to one implementation of the present application.

Referring to FIG. 11B, PCM RF switch structure 1130B illustrates a cross-sectional view of a portion of a PCM RF switch structure processed in accordance with action 130 in flowchart 100A of FIG. 1A according to one implementation of the present application. FIG. 11B represents a cross-sectional view along line "B-B" in FIG. 11A. As shown in FIG. 11B, PCM RF switch structure 1130B includes substrate 1140, heat spreader 1142, lower dielectric 1144, heating element 1146, nugget 1150, combined layer 1152, PCM 1154 having active segment 1156 and passive segments 1158, contact dielectric 1160, and lower portions 1167 of PCM contacts. Substrate 1140, heat spreader 1142, lower dielectric 1144, heating element 1146, nugget 1150, combined layer 1152, PCM 1154 having active segment 1156 and passive segments 1158, and contact dielectric 1160 in FIG. 11B may have any implementations and advantages described above.

As shown in FIG. 11B, portions of lower interconnect metal 464 (shown in FIG. 4B) have been removed, thereby planarizing lower portions 1167 of PCM contacts with contact dielectric 1160.

Figure 11C:
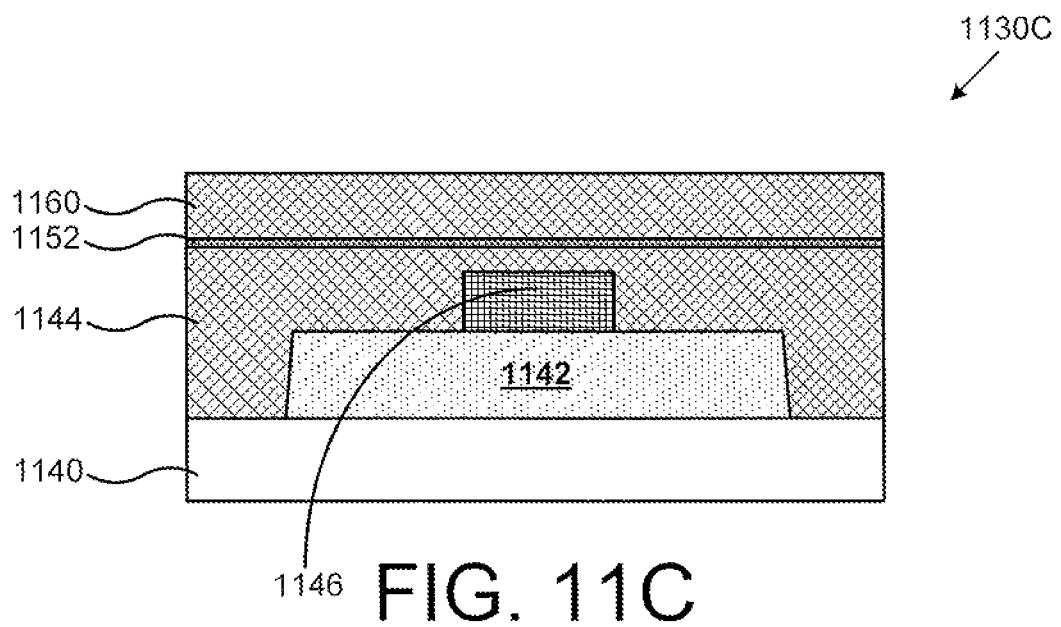

Referring to FIG. 11C, PCM RF switch structure 1130C illustrates a cross-sectional view of a portion of a PCM RF switch structure processed in accordance with action 130 in flowchart 100A of FIG. 1A according to one implementation of the present application. FIG. 11C represents a cross-sectional view along line "C-C" in FIG. 11A. As shown in FIG. 11C, PCM RF switch structure 1130C includes substrate 1140, heat spreader 1142, lower dielectric 1144, heating element 1146, combined layer 1152, and contact dielectric 1160. Substrate 1140, heat spreader 1142, lower dielectric 1144, heating element 1146, combined layer 1152, and contact dielectric 1160 in FIG. 11C may have any implementations and advantages described above. Notably, the cross-sectional view of PCM RF switch structure 1130C in FIG. 11C does not include lower portions 1167 of PCM contacts, because line "C-C" in FIG. 1 1A lies along terminal segment 1148 of heating element 1146, which extends outward and is transverse to PCM 1154.

Figure 12A:
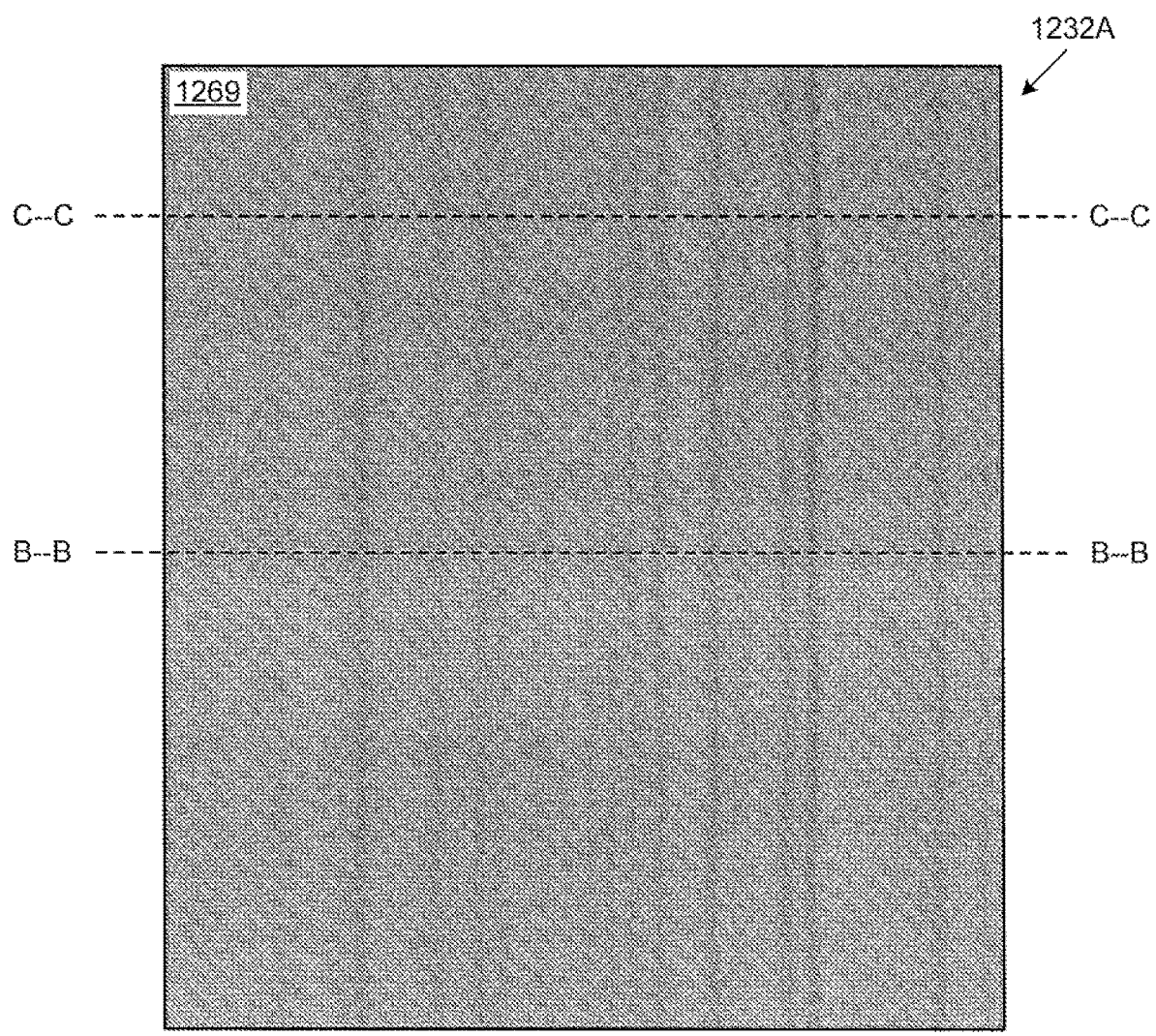
FIG. 12A illustrates a top view of a portion of a PCM RF switch structure processed in accordance with an action in the flowchart of FIG. 1A according to one implementation of the present application.

Referring to FIG. 12A, PCM RF switch structure 1232A illustrates a top view of a portion of a PCM RF switch structure processed in accordance with action 132 in flowchart 100A of FIG. 1A according to one implementation of the present application. As shown in FIG. 12A, PCM RF switch structure 1232A includes lower interconnect metal 1269. For purposes of illustration, the top view in FIG. 12A shows selected structures of PCM RF switch structure 1232A. PCM RF switch structure 1232A may include other structures not shown in FIG. 12A. Notably, in FIG. 12A, lower interconnect metal 1269 is situated atop PCM RF switch structure 1232A, but not in any holes, such as holes 362 (shown in FIG. 3B).

Figure 12B:
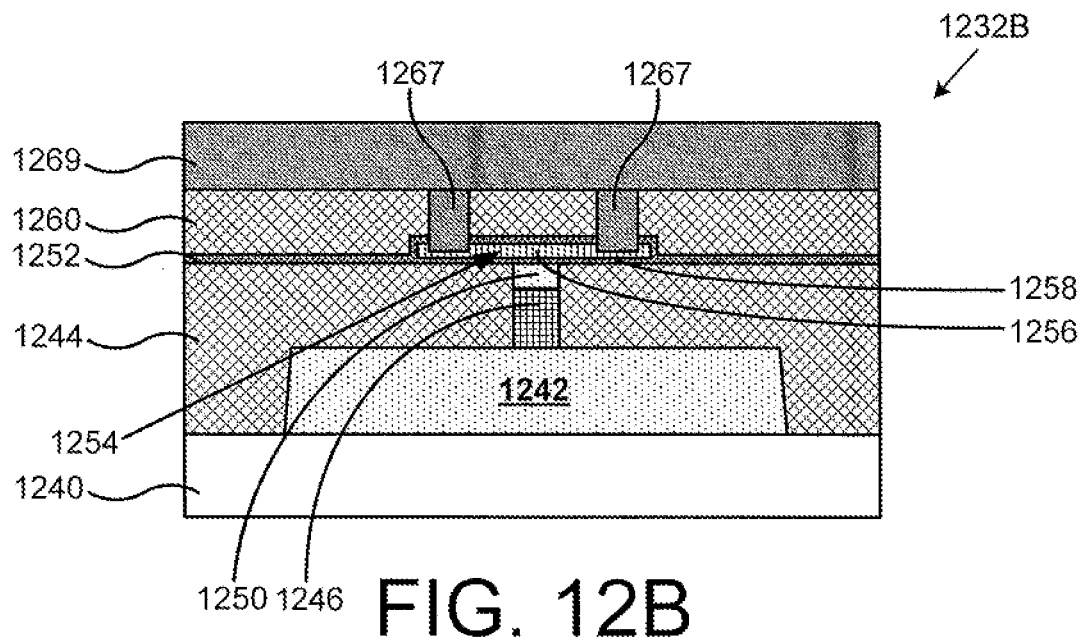
FIGS. 12B and 12C each illustrate a cross-sectional view of a portion of a PCM RF switch structure processed in accordance with an action in the flowchart of FIG. 1A according to one implementation of the present application.

Referring to FIG. 12B, PCM RF switch structure 1232B illustrates a cross-sectional view of a portion of a PCM RF switch structure processed in accordance with action 132 in flowchart 1100A of FIG. 1A according to one implementation of the present application. FIG. 12B represents a cross-sectional view along line "B-B" in FIG. 12A. As shown in FIG. 12B, PCM RF switch structure 1232B includes substrate 1240, heat spreader 1242, lower dielectric 1244, heating element 1246, nugget 1250, combined layer 1252, PCM 1254 having active segment 1256 and passive segments 1258, contact dielectric 1260, lower portions 1267 of PCM contacts, and lower interconnect metal 1269. Substrate 1240, heat spreader 1242, lower dielectric 1244, heating element 1246, nugget 1250, combined layer 1252, PCM 1254 having active segment 1256 and passive segments 1258, contact dielectric 1260, and lower portions 1267 of PCM contacts in FIG. 12B may have any implementations and advantages described above.

As shown in FIG. 12B, lower interconnect metal 1269 is deposited over lower portions 1267 of PCM contacts and over contact dielectric 1260. In various implementations, lower interconnect metal 1269 can comprise W, Cu, or Al. In the present implementation, the top surface of lower interconnect metal 1269 has no indents or minimal indents in the vicinity of lower portions 1267 of PCM contacts, since lower portions 1267 of PCM contacts are coplanar with contact dielectric 1260.

Figure 12C:
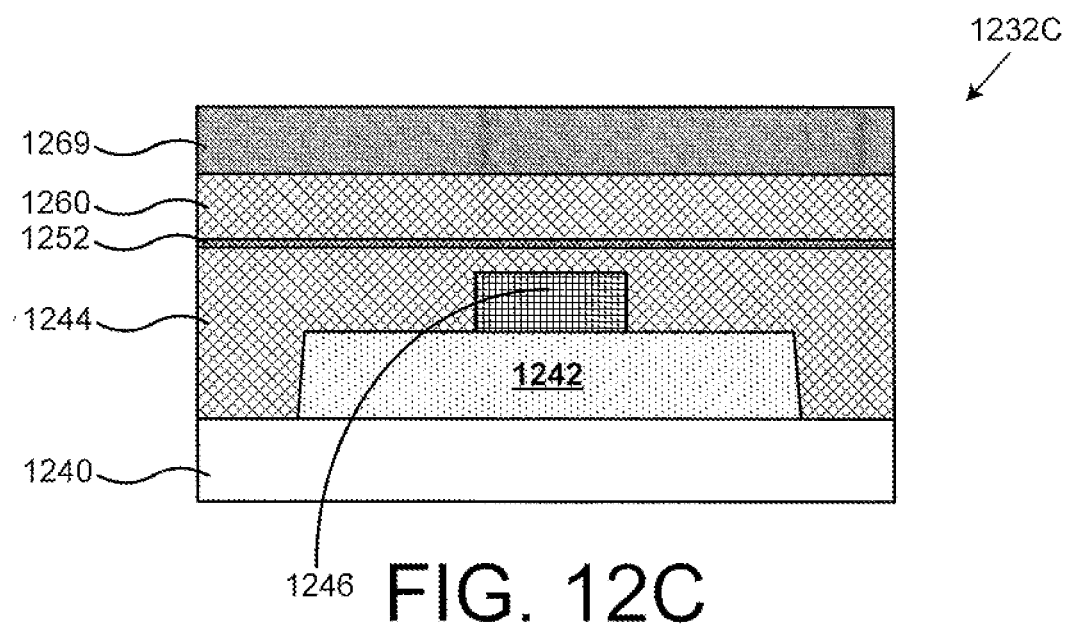

Referring to FIG. 12C, PCM RF switch structure 1232C illustrates a cross-sectional view of a portion of a PCM RF switch structure processed in accordance with action 132 in flowchart 100A of FIG. 1A according to one implementation of the present application. FIG. 12C represents a cross-sectional view along line "C-C" in FIG. 12A. As shown in FIG. 12C, PCM RF switch structure 1232C includes substrate 1240, heat spreader 1242, lower dielectric 1244, heating element 1246, combined layer 1252, contact dielectric 1260, and lower interconnect metal 1269. Substrate 1240, heat spreader 1242, lower dielectric 1244, heating element 1246, combined layer 1252, contact dielectric 1260 in FIG. 12C may have any implementations and advantages described above. Notably, the cross-sectional view of PCM RF switch structure 1232C in FIG. 12C does not include lower portions 1267 of PCM contacts, because line "C-C" in FIG. 12A lies along a terminal segment of heating element 1246, which extends outward and is transverse to PCM 1254.

Figure 13A:
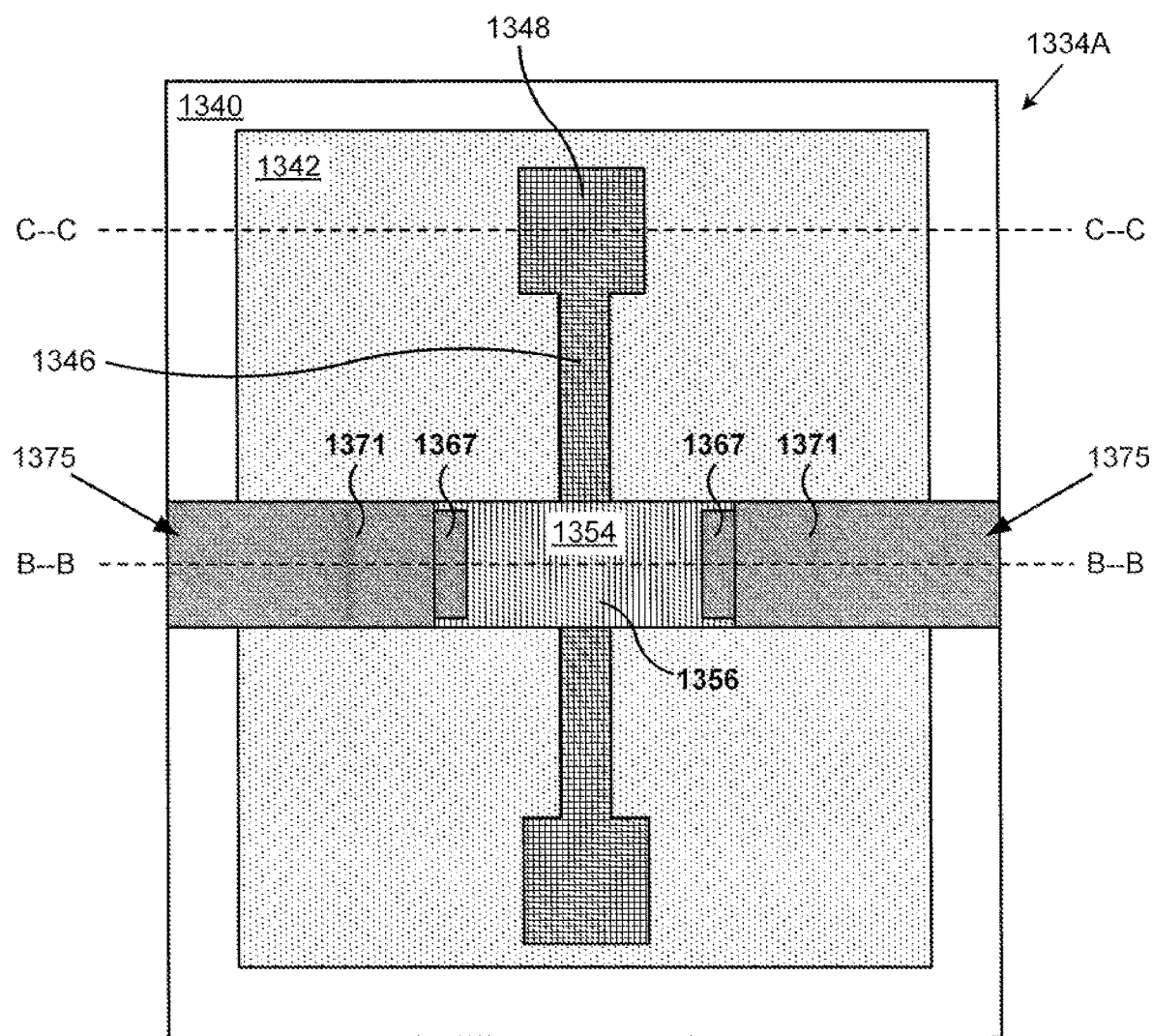
FIG. 13A illustrates a top view of a portion of a PCM RF switch structure processed in accordance with an action in the flowchart of FIG. 1A according to one implementation of the present application.

Referring to FIG. 13A, PCM RF switch structure 1334A illustrates a top view of a portion of a PCM RF switch structure processed in accordance with action 134 in flowchart 100A of FIG. 1A according to one implementation of the present application. As shown in FIG. 13A, PCM RF switch structure 1334A includes substrate 1340, heat spreader 1342, heating element 1346 having terminal segments 1348, PCM 1354 having active segment 1356, and PCM contacts 1375 having lower portions 1367 and upper portions 1371. For purposes of illustration, the top view in FIG. 13A shows selected structures of PCM RF switch structure 1334A. PCM RF switch structure 1334A may include other structures not shown in FIG. 13A. Notably, in FIG. 13A, upper portions 1371 of PCM contacts 1375 are formed from lower interconnect metal 1269 (shown in FIG. 12A).

Figure 13B:
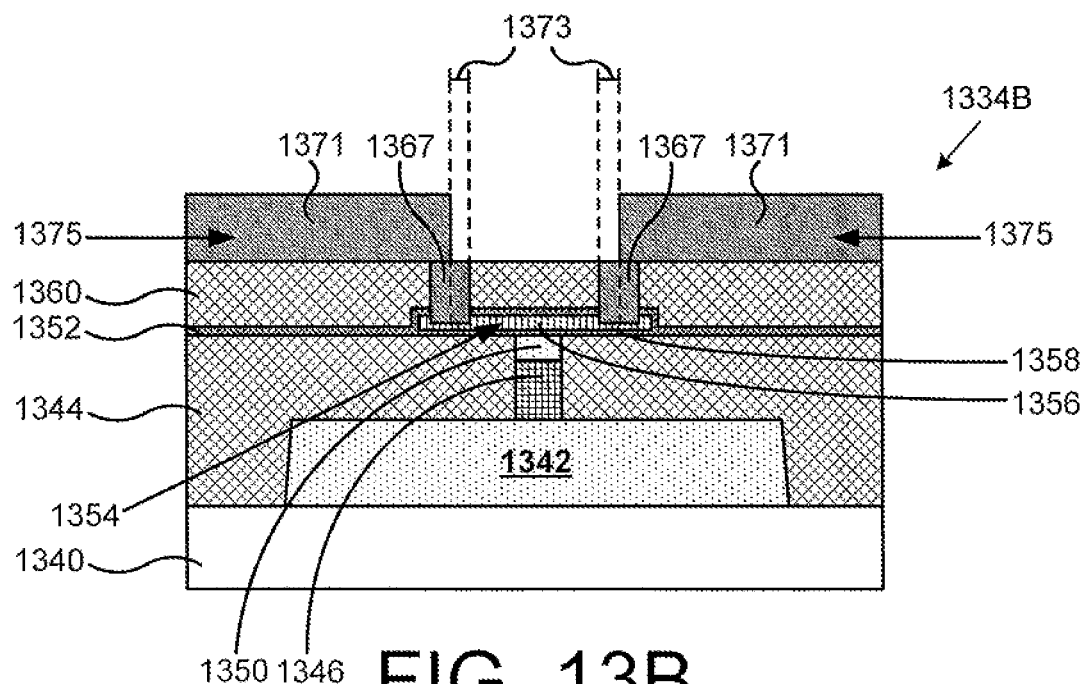
FIGS. 13B and 13C each illustrate a cross-sectional view of a portion of a PCM RF switch structure processed in accordance with an action in the flowchart of FIG. 1A according to one implementation of the present application.

Referring to FIG. 13B, PCM RF switch structure 1334B illustrates a cross-sectional view of a portion of a PCM RF switch structure processed in accordance with action 134 in flowchart 100A of FIG. 1A according to one implementation of the present application. FIG. 13B represents a cross-sectional view along line "B-B" in FIG. 13A. As shown in FIG. 13B, PCM RF switch structure 1334B includes substrate 1340, heat spreader 1342, lower dielectric 1344, heating element 1346, nugget 1350, combined layer 1352, PCM 1354 having active segment 1356 and passive segments 1358, contact dielectric 1360, and PCM contacts 1375 having lower portions 1367 and upper portions 1371. Substrate 1340, heat spreader 1342, lower dielectric 1344, heating element 1346, nugget 1350, combined layer 1352, PCM 1354 having active segment 1356 and passive segments 1358, contact dielectric 1360, and lower portions 1367 of PCM contacts 1375 in FIG. 13B may have any implementations and advantages described above.

As shown in FIG. 13B, lower interconnect metal 1269 (shown in FIG. 12B) has been patterned, thereby forming upper portions 1371 of PCM contacts 1375. Because forming PCM contacts 1375 shown in FIG. 13B uses two metal depositions, PCM contacts 1375 have lower portions 1367 connected to passive segments 1358 of PCM 1354 in holes 362 (shown in FIG. 3B), and have upper portions 1371 having offsets 1373 away from active segment 1356 of PCM 1354. Compared to offsets 572 in FIG. 5B, offsets 1373 in FIG. 13C reduce OFF state parasitic capacitance ($C_{OFF}$) between PCM contacts 1375 due to the increased distance between PCM contacts 1375 on each side of PCM 1354, thereby improving performance of PCM RF switch structure 1334B. In one implementation, lower portions 1367 of PCM contacts 1375 can comprise a different material than upper portions 1371 of PCM contacts. For example, in one implementation, lower portions 1367 of PCM contacts 1375 comprise a material that exhibits little or substantially no electromigration, while upper portions 1371 of PCM contacts 1375 comprise a metal that can be patterned relatively easily.

Figure 13C:
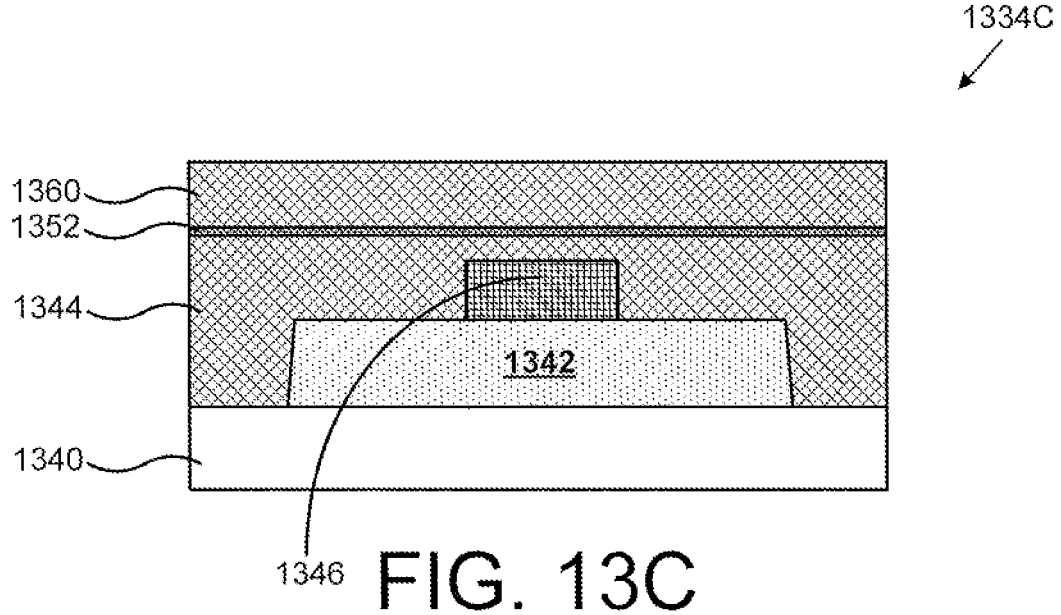

Referring to FIG. 13C, PCM RF switch structure 1334C illustrates a cross-sectional view of a portion of a PCM RF switch structure processed in accordance with action 134 in flowchart 100A of FIG. 1A according to one implementation of the present application. FIG. 13C represents a cross-sectional view along line "C-C" in FIG. 13A. As shown in FIG. 13C, PCM RF switch structure 1334C includes substrate 1340, heat spreader 1342, lower dielectric 1344, heating element 1346, combined layer 1352, and contact dielectric 1360. Substrate 1340, heat spreader 1342, lower dielectric 1344, heating element 1346, combined layer 1352, and contact dielectric 1360 in FIG. 13C may have any implementations and advantages described above. Notably, the cross-sectional view of PCM RF switch structure 1334C in FIG. 13C does not include PCM contacts 1375, because line "C-C" in FIG. 13A lies along terminal segment 1348 of heating element 1346, which extends outward and is transverse to PCM 1354.

Figure 14A:
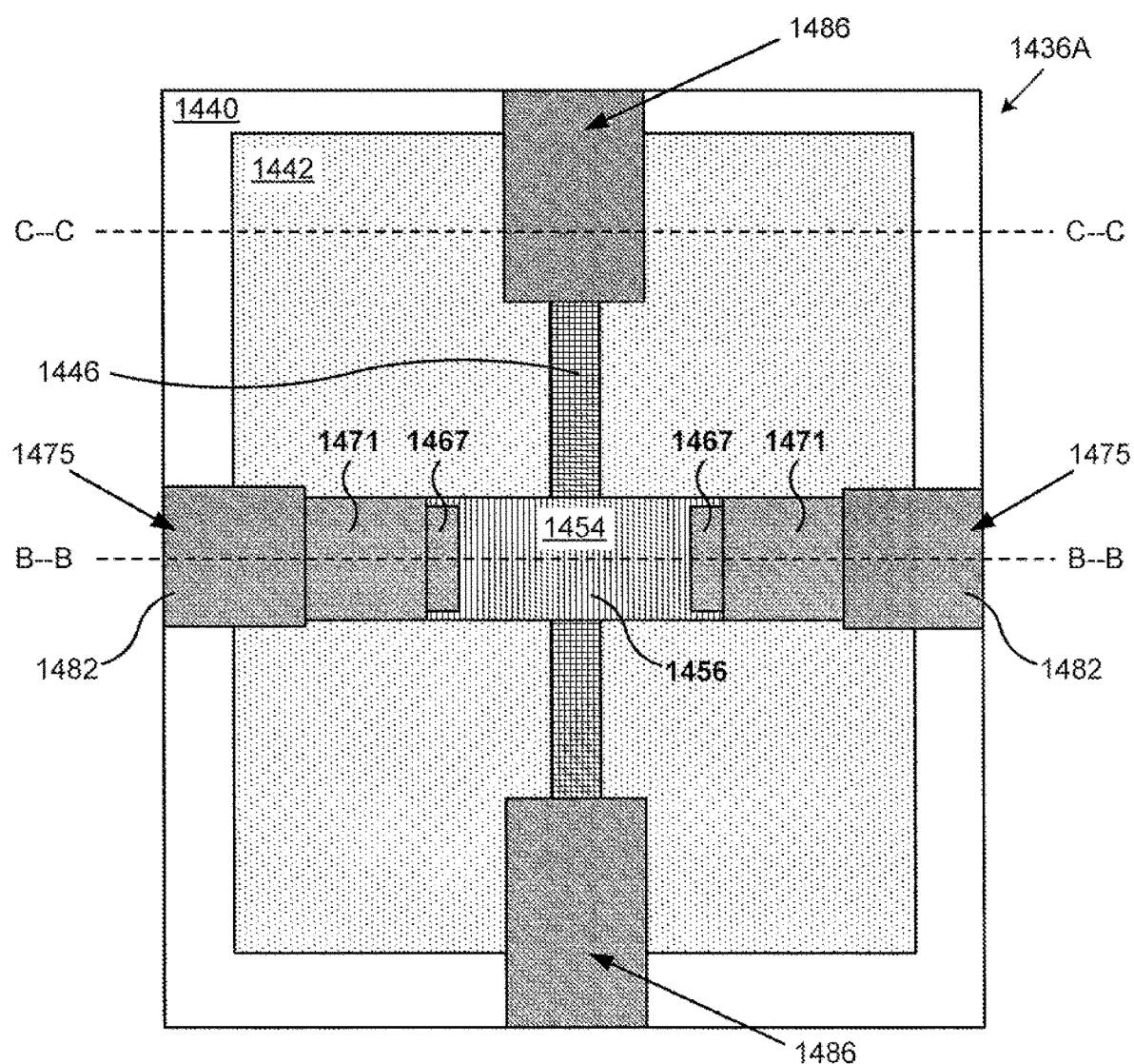
FIG. 14A illustrates a top view of a portion of a PCM RF switch structure processed in accordance with an action in the flowchart of FIG. 1A according to one implementation of the present application.
Figure 14B:
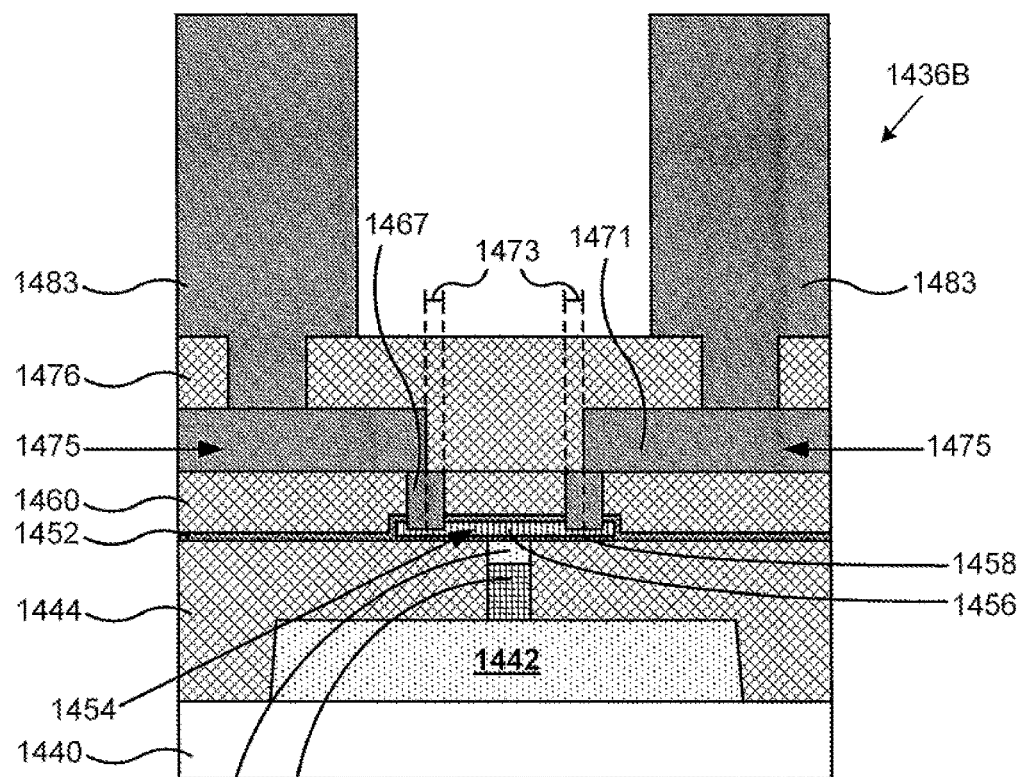
FIGS. 14B and 14C each illustrate a cross-sectional view of a portion of a PCM RF switch structure processed in accordance with an action in the flowchart of FIG. 1A according to one implementation of the present application.
Figure 14C:
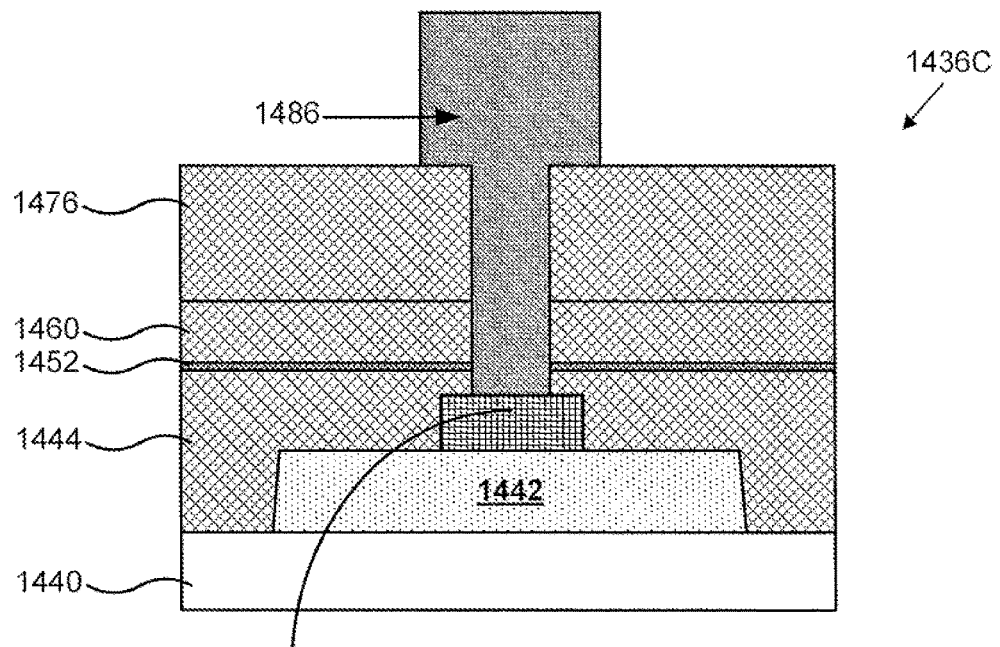

Referring to FIGS. 14A, 14B, and 14C, PCM RF switch structures 1436A, 1436B, and 1436C in FIGS. 14A, 14B, and 14C represent a substantially complete PCM RF switch according to one implementation where upper portions 1471 of PCM contacts 1475 have offsets 1473 away from active segment 1456 of PCM 1454, after performing action 136 of completing contacts by remaining manufacturing actions. In this present implementation, the remaining manufacturing actions of action 136 are analogous to actions 120 through 128, and therefore these remaining manufacturing actions are not shown in detail. Only the substantially complete PCM RF switch is shown in FIGS. 14A, 14B, and 14C.

Referring to FIG. 14A, PCM RF switch structure 1436A illustrates a top view of a portion of a PCM RF switch structure processed in accordance with action 136 in flowchart 100A of FIG. 1A according to one implementation of the present application. As shown in FIG. 14A, PCM RF switch structure 1436A includes substrate 1440, heat spreader 1442, heating element 1446, PCM 1454 having active segment 1456, PCM contacts 1475 having lower portions 1467, upper portions 1471, and top interconnects 1483, and heating element contacts 1486. For purposes of illustration, the top view in FIG. 14A shows selected structures of PCM RF switch structure 1436A. PCM RF switch structure 1436A may include other structures not shown in FIG. 14A. Notably, in FIG. 14A, top interconnect metal has been patterned. As a result, heating element contacts 1486 are formed cross-wise to PCM contacts 1475. As used herein, "cross-wise" refers to the fact that PCM contacts 1475 are not situated in the same row or in the same column as heating element contacts 1486.

Referring to FIG. 14B, PCM RF switch structure 1436B illustrates a cross-sectional view of a portion of a PCM RF switch structure processed in accordance with action 136 according to one implementation of the present application. FIG. 14B represents a cross-sectional view along line "B-B" in FIG. 14A. As shown in FIG. 14B, PCM RF switch structure 1436B includes substrate 1440, heat spreader 1442, lower dielectric 1444, heating element 1446, nugget 1450, combined layer 1452, PCM 1454 having active segment 1456 and passive segments 1458, contact dielectric 1460, PCM contacts 1475 having lower portions 1467, upper portions 1471 with offset 1473, and top interconnects 1483, and interconnect dielectric 1476. Substrate 1440, heat spreader 1442, lower dielectric 1444, heating element 1446, nugget 1450, combined layer 1452, PCM 1454 having active segment 1456 and passive segments 1458, contact dielectric 1460, PCM contacts 1475 having lower portions 1467, upper portions 1471 with offset 1473, and top interconnects 1483, and interconnect dielectric 1476 in FIG. 14B may have any implementations and advantages described above.

As shown in FIG. 14B, top interconnect metal has been patterned. As a result, top interconnects 1483 of PCM contacts 1475 are formed. Top interconnects 1483 are connected to and substantially overlie terminal segments of upper portions 1471 of PCM contacts 1475.

Referring to FIG. 14C, PCM RF switch structure 1436C illustrates a cross-sectional view of a portion of a PCM RF switch structure processed in accordance with action 136 in flowchart 100A of FIG. 1A according to one implementation of the present application. FIG. 14C represents a cross-sectional view along line "C-C" in FIG. 14A. As shown in FIG. 14C, PCM RF switch structure 1436C includes substrate 1440, heat spreader 1442, lower dielectric 1444, heating element 1446, combined layer 1452, contact dielectric 1460, interconnect dielectric 1476, and heating element contact 1486. Substrate 1440, heat spreader 142, lower dielectric 1444, heating element 1446, combined layer 1452, contact dielectric 1460, interconnect dielectric 1476, and heating element contact 1486 in FIG. 14C may have any implementations and advantages described above.

As shown in FIG. 14C, top interconnect metal has been patterned. As a result, heating element contacts 1486 are formed. Heating element contacts 1486 are connected to and substantially overlie terminal segments of heating element 1446.

Figure 15:
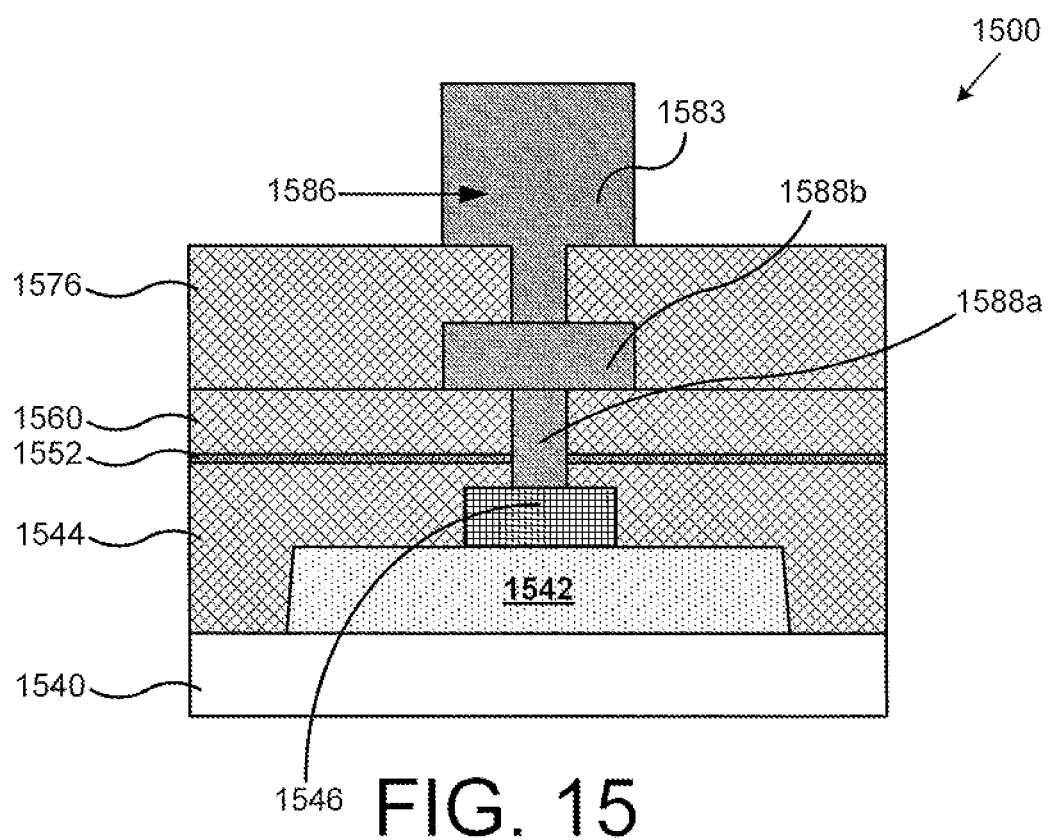
FIG. 15 illustrates a cross-sectional view of a portion of an PCM RF switch structure according to one implementation of the present application.

Referring to FIG. 15, PCM RF switch structure 1500 illustrates a cross-sectional view of a portion of a PCM RF switch structure according to one implementation of the present application. FIG. 15 represents a cross-sectional view along line "C-C" in FIG. 10A or 14A for an alternative implementation where the top interconnect metal does not directly connect to the heating element. As shown in FIG. 15, PCM RF switch structure 1500 includes substrate 1540, heat spreader 1542, lower dielectric 1544, heating element 1546, combined layer 1552, contact dielectric 1560, interconnect dielectric 1576, and heating element contact 1586 having top interconnect 1583 and intermediate metal segments 1588a and 1588b. Substrate 1540, heat spreader 1542, lower dielectric 1544, heating element 1546, combined layer 1552, contact dielectric 1560, interconnect dielectric 1576, and top interconnect 1583 in FIG. 15 may have any implementations and advantages described above.

As shown in FIG. 15, heating element contact 1586 includes top interconnect 1583 and intermediate metal segments 1588a and 1588b. Intermediate metal segment 1588a is situated on heating element 1546, extends through lower dielectric 1544, combined layer 1552 (in case combined layer 1552 is utilized), and contact dielectric 1560, and connects to intermediate metal segment 1588b. Intermediate metal segment 1588b is situated on intermediate metal segment 1588a and contact dielectric 1560, extends partially through interconnect dielectric 1576, and connects to top interconnect 1583. Top interconnect 1583 is situated on intermediate metal segment 1588b and interconnect dielectric 1576. In various implementations, heating element contact 1586 can include more or fewer intermediate metal segments having different sizes or shapes and situated on or extending through different layers. In various implementations, intermediate metal segments are formed overlying terminal segments of lower active structures away from an active segment of PCM.

By utilizing the methods disclosed in the present application, contacts for an RF switch employing phase-change material, such as PCM 1054 in FIGS. 10A and 10B, can be reliably manufactured. Lower portions 1066 of PCM contacts 1074 connect to passive segments 1058 of PCM 1054 that extend outward and are transverse to heating element 1046, reducing parasitic capacitance between PCM contacts 1074 and heating element 1046, and reducing $C_{OFF}$ of PCM RF switch 1028A/1028B. Because lower portions 1066 of PCM contacts 1074 connect to passive segments 1058 of PCM 1054, lower portions 1066 of PCM contacts 1074 are also subject to less thermal cycling and thus, less variation in $R_{ON}$, and less possibility of damage. Using contact uniformity support layer in combined layer 1052 over PCM 1054 as an etch stop during formation of lower portions 1066 of PCM contacts 1074 advantageously reduces $R_{ON}$. PCM contacts 1074 with upper portions 1070 having offsets 1072 towards active segment 1056 of PCM 1054 can reduce manufacturing complexity. Meanwhile, in the alternative implementation and referring to FIGS. 14A and 14B, PCM contacts 1475 with upper portions 1471 having offsets 1473 away from active segment 1456 of PCM 1454 reduce parasitic capacitance between PCM contacts 1475, reducing $C_{OFF}$ of PCM RF switch 1436B.

In a departure from conventional contact formation, holes 362 (shown in FIG. 3B) in contact dielectric 1060 overlying passive segments 1058 of PCM 1054, and holes 778 (shown in FIG. 7B) in interconnect dielectric 1076 overlying terminal segments of upper portions 1070 of PCM contacts 1074, can each be formed separately from holes 880 (shown in FIG. 8C) in interconnect dielectric 1076 and contact dielectric 1060 overlying terminal segments of heating element 1046. Top interconnect metal 982 (shown in FIGS. 9B and 9C) can be deposited to different depths, and thus, can be patterned to form both top interconnects 1083 of PCM contacts 1074 and heating element contacts 1086 directly connected to heating element 1046, which underlies PCM 1054.

Finally, heating element contacts 1086 are formed crosswise to PCM contacts 1074, and metal layers thereof are formed overlying terminal segments of lower active structures away from active segment 1056 of PCM 1054. Thus, PCM contacts 1074 and heating element contacts 1086 have effectively increased separation. Because larger contacts are necessary to efficiently operate a switch, but detrimentally increase RF parasitic capacitance, this increased separation significantly reduces parasitic capacitance between PCM contacts 1074 and heating element contacts 1086, reducing $C_{OFF}$ of PCM RF switch 1028A.

Thus, various implementations of the present application achieve a method of manufacturing a PCM RF switch that overcomes the deficiencies in the art. From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

The invention claimed is:

1. A radio frequency (RF) switch comprising:
a phase-change material (PCM) and a heating element approximately underlying an active segment of said PCM and extending outward and transverse to said PCM;
PCM contacts comprising lower portions and upper portions;
said lower portions of said PCM contacts connected to passive segments of said PCM, wherein said passive segments extend outward and are transverse to said heating element;
said upper portions of said PCM contacts made from a lower interconnect metal, wherein said upper portions of said PCM contacts have an offset away from said active segment of said PCM;
heating element contacts comprising a top interconnect metal and intermediate metal segments for connecting with terminal segments of said heating element;
said heating element contacts being situated cross-wise to said PCM contacts so as to reduce a $C_{OFF}$ of said PCM.

2. The radio frequency (RF) switch of claim 1, further comprising a contact uniformity support layer over said PCM.

3. The radio frequency (RF) switch of claim 1, further including a nugget comprising a thermally conductive and electrically insulating material situated on top of said heating element.

4. The radio frequency (RF) switch of claim 3, wherein said thermally conductive and electrically insulating material is selected from the group consisting of AlN, $Al_xO_y$, $Be_xO_y$, SiC, $Si_xN_y$, diamond, and diamond-like carbon.

5. The radio frequency (RF) switch of claim 1, wherein said lower portions of said PCM contacts are formed from said lower interconnect metal.

6. The radio frequency (RF) switch of claim 1, wherein said lower portions of said PCM contacts are planarized with a contact dielectric.

7. The radio frequency (RF) switch of claim 1, wherein said PCM comprises a material selected from the group consisting of germanium telluride ($Ge_xTe_y$), germanium antimony telluride ($Ge_xSb_yTe_z$), germanium selenide ($Ge_xSe_y$), and any other chalcogenide.

8. A radio frequency (RF) switch comprising:
a phase-change material (PCM) and a heating element approximately underlying an active segment of said PCM;
a PCM contact comprising a lower portion and an upper portion;
said lower portion of said PCM contact connected to a passive segment of said PCM;
said upper portion of said PCM contact having an offset away from said active segment of said PCM;
a heating element contact comprising a top interconnect metal and intermediate metal segments for connecting with a terminal segment of said heating element.

9. The radio frequency (RF) switch of claim 8, wherein said upper portion of said PCM contact is made from a lower interconnect metal.

10. The radio frequency (RF) switch of claim 9, wherein said lower portion of said PCM contact is formed from said lower interconnect metal.

11. The radio frequency (RF) switch of claim 8, wherein said lower portion of said PCM contact is planarized with a contact dielectric.

12. The radio frequency (RF) switch of claim 8 further comprising a contact uniformity support layer over said PCM.

13. The radio frequency (RF) switch of claim 8 further including a nugget comprising a thermally conductive and electrically insulating material situated on top of said heating element.

14. The radio frequency (RF) switch of claim 13, wherein said thermally conductive and electrically insulating material is selected from the group consisting of AlN, $Al_xO_y$, $Be_xO_y$, SiC, $Si_xN_y$, diamond, and diamond-like carbon.

15. The radio frequency (RF) switch of claim 8, wherein said PCM comprises a material selected from the group consisting of germanium telluride ($Ge_xTe_y$), germanium antimony telluride ($Ge_xSb_yTe_z$), germanium selenide ($Ge_xSe_y$), and any other chalcogenide.

16. A radio frequency (RF) switch comprising:
a phase-change material (PCM) and a heating element approximately underlying an active segment of said PCM and extending outward and transverse to said PCM;
a thermally conductive and electrically insulating material situated over said heating element;
PCM contacts comprising lower portions and upper portions;
said lower portions of said PCM contacts connected to passive segments of said PCM, wherein said passive segments extend outward and are transverse to said heating element;
said upper portions of said PCM contacts made from a lower interconnect metal wherein said upper portions of said PCM contacts have an offset away from said active segment of said PCM;

heating element contacts comprising a top interconnect metal and intermediate metal segments for connecting with terminal segments of said heating element.

17. The radio frequency (RF) switch of claim 16 further comprising a contact uniformity support layer over said PCM.

18. The radio frequency (RF) switch of claim 16, wherein said thermally conductive and electrically insulating material is selected from the group consisting of AlN, $Al_XO_Y$, $Be_XO_Y$, SiC, $Si_XN_Y$, diamond, and diamond-like carbon.

19. The radio frequency (RF) switch of claim 16, wherein said PCM comprises a material selected from the group consisting of germanium telluride ($Ge_XTe_Y$), germanium antimony telluride ($Ge_XSb_YTe_Z$), germanium selenide ($Ge_XSe_Y$), and any other chalcogenide.

20. The radio frequency (RF) switch of claim 16, wherein said thermally conductive and electrically insulating material is selected from the group consisting of AlN, $Al_XO_Y$, $Be_XO_Y$, SiC, $Si_XN_Y$, diamond, and diamond-like carbon, and wherein said PCM comprises a material selected from the group consisting of germanium telluride ($Ge_XTe_Y$), germanium antimony telluride ($Ge_XSb_YTe_Z$), germanium selenide ($Ge_XSe_Y$), and any other chalcogenide.

* * * * *